United States Patent
Denison et al.

(10) Patent No.: US 8,492,233 B2
(45) Date of Patent: Jul. 23, 2013

(54) CONFIGURABLE NP CHANNEL LATERAL DRAIN EXTENDED MOS-BASED TRANSISTOR

(75) Inventors: Marie Denison, Plano, TX (US); Hannes Estl, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 134 days.

(21) Appl. No.: 12/883,726

(22) Filed: Sep. 16, 2010

(65) Prior Publication Data

US 2011/0074493 A1    Mar. 31, 2011

Related U.S. Application Data

(60) Provisional application No. 61/243,015, filed on Sep. 16, 2009.

(51) Int. Cl.
   *H01L 29/43*    (2006.01)
(52) U.S. Cl.
   USPC ............... 438/286; 257/343; 257/E21.417
(58) Field of Classification Search
   USPC .... 257/285, 343, E21.417, E29.022; 438/286
   See application file for complete search history.

(56) References Cited

U.S. PATENT DOCUMENTS

| | | | |
|---|---|---|---|
| 6,097,063 A * | 8/2000 | Fujihira | 257/339 |
| 2008/0012043 A1 * | 1/2008 | Udrea et al. | 257/163 |

OTHER PUBLICATIONS

Denison, M.; Xie; Yizhong; H. Estl, "Investigation of a Dual Channel N/P-LDMOS and Application to LDO Linear Voltage Regulation", Solid-State Device Research Conference (ESSDERC), 2010 Proceedings of the European, Sep. 14-16, 2010 pp. 277-280.
Udrea, F; Popescu, A.; Milne, W.I., "3D RESURF double-gate MOSFET: A revolutionary power device concept", Electronics Letters, Apr. 16, 1998, pp. 808-809, vol. 34. Issue 8.
Udrea, F; Popescu, A.; Milne, W., "The 3D RESURF junction," Semiconductor Conference, 1998. CAS '98 Proceedings. 1998 International, vol. 1, No., pp. 141-144 vol. 1, Oct. 6-10, 1998.

* cited by examiner

*Primary Examiner* — Thomas L Dickey
(74) *Attorney, Agent, or Firm* — Warren L. Franz; Wade J. Brady, III; Frederick J. Telecky, Jr.

(57) ABSTRACT

An integrated circuit containing a configurable dual n/p-channel 3-D resurf high voltage MOS field effect transistor (MOSFET) is disclosed. An n-channel drain is coterminous with a p-channel source in an n-well, and a p-channel drain is coterminous with an n-channel source in a p-well. A lateral drift region including n-type drift lanes and p-type drift lanes extends between the n and p wells. A resurf layer abuts the lateral drift region. The n-channel MOS gate is separate from the p-channel MOS gate. The p-channel MOS gate may be operated as a field plate in the n-channel mode, and vice versa. An n-channel MOS transistor may be integrated into the n-channel MOS source to provide an n-channel cascode transistor configuration, and similarly for a p-channel cascode configuration, to debias parasitic bipolar transistors under the MOS gates. Circuits using the MOSFET with various loads are also disclosed.

23 Claims, 15 Drawing Sheets

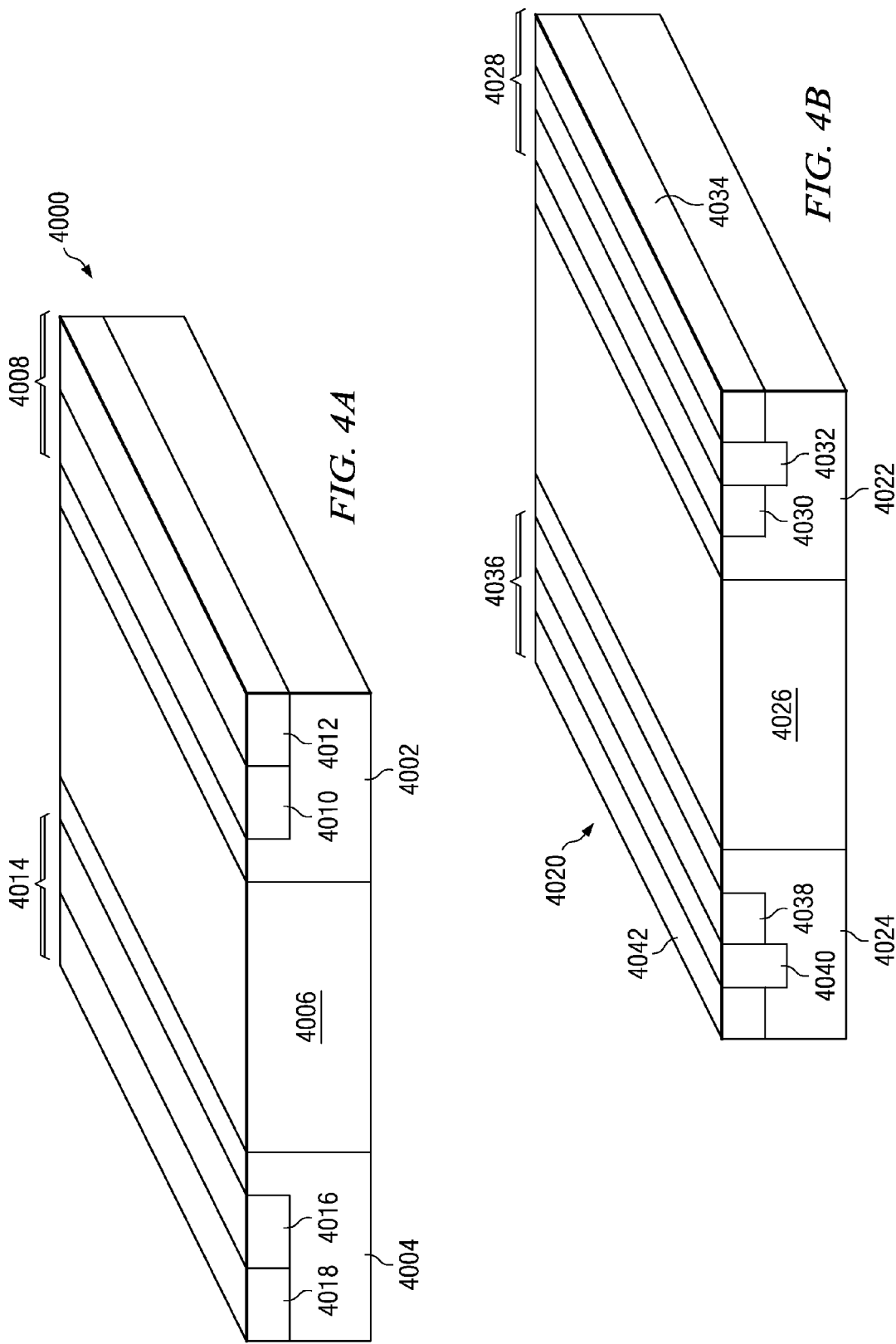

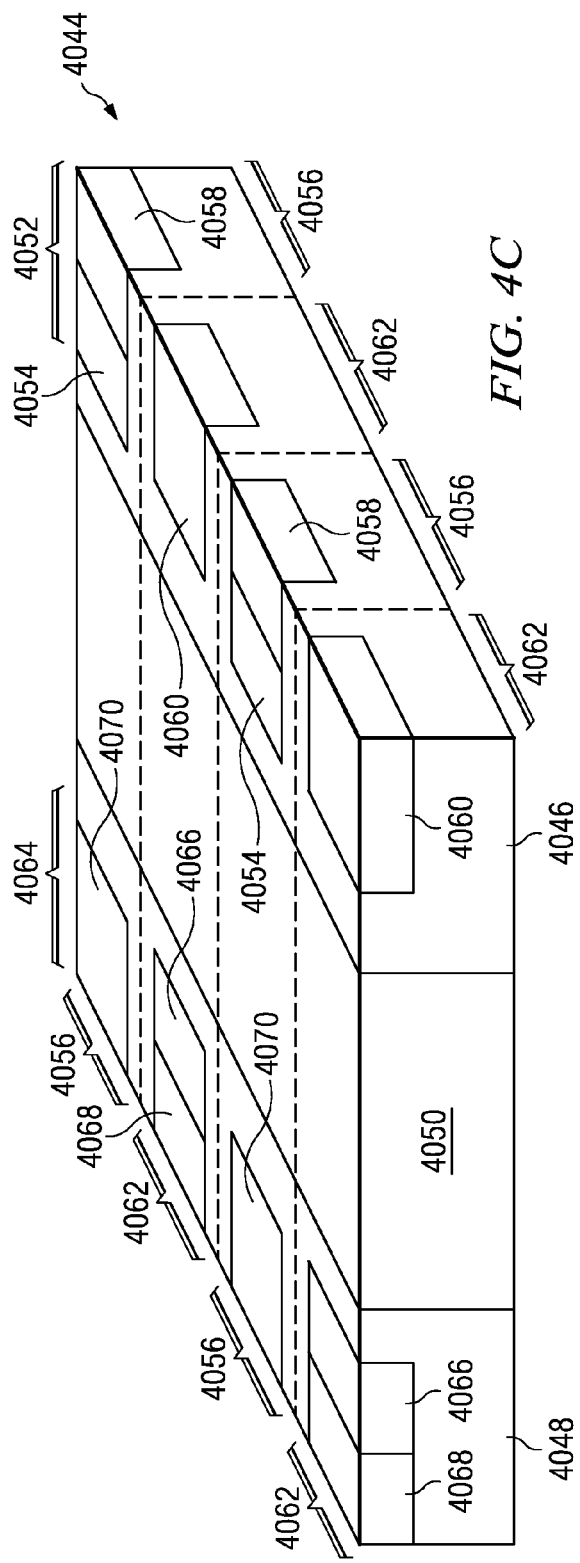

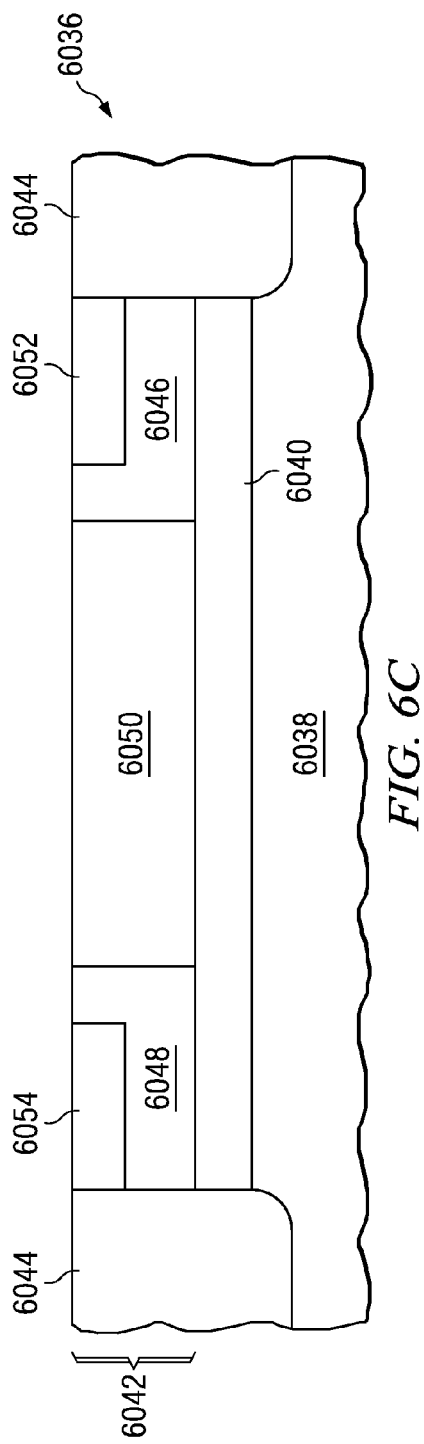
FIG. 6C
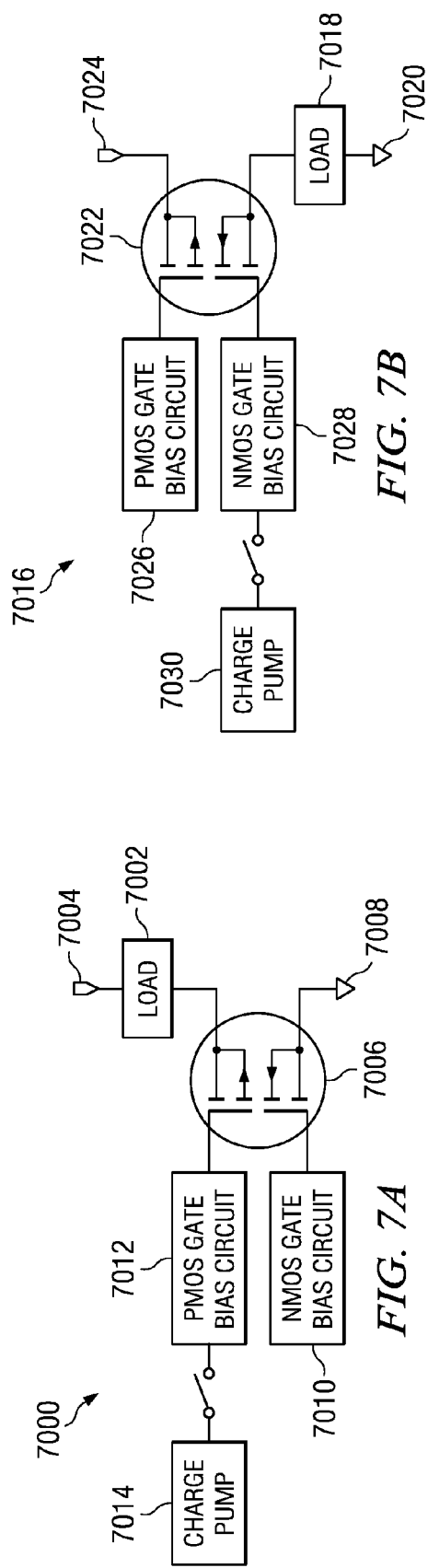
FIG. 7A
FIG. 7B

CONFIGURABLE NP CHANNEL LATERAL DRAIN EXTENDED MOS-BASED TRANSISTOR

This application claims the benefit of U.S. Provisional Application No. 61/243,015, filed Sep. 16, 2009, the entirety of which is herein incorporated by reference.

BACKGROUND

This invention relates to the field of integrated circuits; and, more particularly, to MOS transistors and their manufacture.

Integrating components such as metal oxide semiconductor field effect transistors (MOSFET) which can handle high blocking voltages into integrated circuits is problematic. High voltage transistors such as drain extended MOS transistors require large depletion regions, undesirably increasing the size and cost of the integrated circuits. Some circuits would benefit from drain extended transistors capable of both n-channel and p-channel modes of operation. Incorporating separate p-channel drain extended MOS transistors and n-channel drain extended MOS transistors in such circuits also undesirably increases the size and cost of the integrated circuits.

SUMMARY

The invention provides an integrated circuit including a MOS transistor, and a method of fabricating the same.

In a described embodiment, the MOS transistor may take the form of a configurable dual channel 3-D resurf drain extended MOSFET that includes an n-channel drain coterminous with a p-channel source in an n-well; a p-channel drain coterminous with an n-channel source in a p-well; a lateral drift region between the n-well and the p-well which includes n-type drift lanes and p-type drift lanes; and a resurf layer adjacent to the drift lanes. An n-channel MOS gate over the p-well controls current when the MOSFET is operated in an n-channel mode. Similarly, a p-channel MOS gate over the n-well controls current when the MOSFET is operated in a p-channel mode. In the n-channel mode, the p-channel MOS gate may be operated as a field plate to reduce peak electric fields in the n-type drift lanes. Similarly, in the p-channel mode, the n-channel MOS gate may be operated as a field plate to reduce peak electric fields in the p-type drift lanes.

An n-channel MOS transistor embodiment may be integrated into the n-channel body (i.e., the backgate) of the 3-D resurf drain extended MOSFET in series with the n-channel source to provide a cascode transistor configuration. A p-channel MOS transistor may be integrated into the p-channel backgate of the 3-D resurf drain extended MOSFET in series with the p-channel source to provide a cascode transistor configuration. Parasitic bipolar transistors may occur, in which a base of the bipolar transistor is located in the backgate, an emitter is located in the source, and a collector is located in the drain. Cascode operation advantageously debiases the parasitic bipolar transistors.

The MOSFET may be used in a switched mode to advantageously provide a lower specific resistance (i.e., the product of the resistance of the transistor times the area of the transistor) for a given blocking voltage compared to MOS transistors. The configurable dual channel 3-D resurf drain extended MOSFET may be used in a saturation mode to advantageously provide a higher current density compared to MOS transistors. It may be operated in a dual mode such that both the n-channel and p-channel are conducting current, advantageously further increasing the current density. Circuits are disclosed that use the configurable dual channel 3-D resurf drain extended MOSFET to regulate currents through and potential differences across various loads.

BRIEF DESCRIPTION OF THE DRAWINGS

FIGS. 4A-4E are perspective section views of integrated circuits including embodiments of n-channel drain and p-channel source regions, and p-channel drain and n-channel source regions, in configurable dual channel 3-D resurf drain extended MOSFETs according to principles of the invention.

FIGS. 6A-6C are cross-sectional views of integrated circuits including embodiments of bottom resurf regions in configurable dual channel 3-D resurf drain extended MOSFETs according to principles of the invention.

FIGS. 7A and 7B are schematic views of embodiments of circuits using configurable dual channel 3-D resurf drain extended MOSFETs according to principles of the invention.

DETAILED DESCRIPTION OF EXAMPLE EMBODIMENTS

Figure 1A:
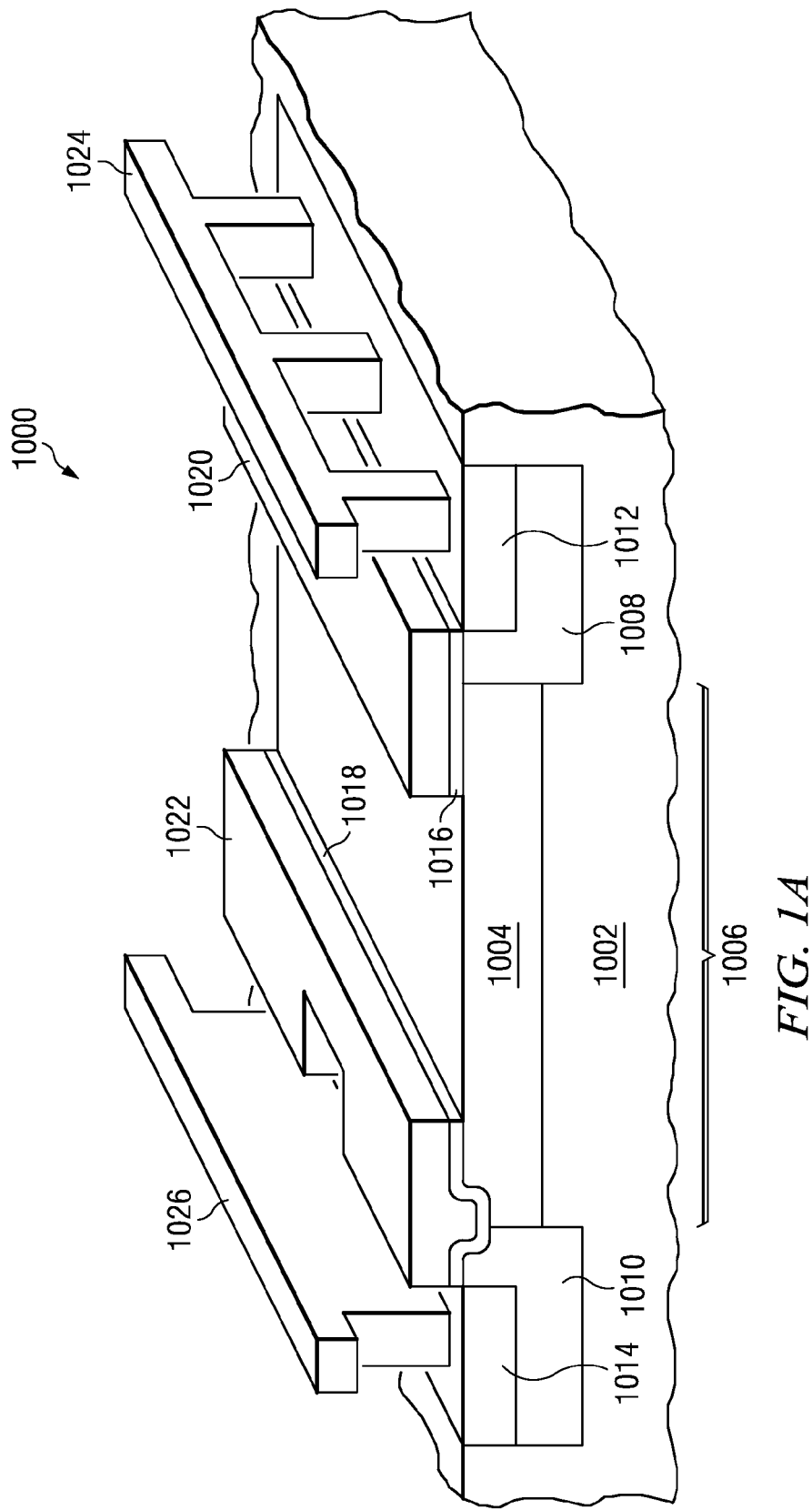
FIGS. 1A and 1B are perspective section views of integrated circuits including embodiments of a configurable dual channel 3-D resurf drain extended MOSFETs according to principles of the invention.

The term "resurf" refers to a configuration of a depletion region including adjacent n-type and p-type regions which deplete each other and reduce a surface electric field compared to a MOSFET configuration including a depletion region without an adjacent surface electric field reducing region. The term "3-D" refers to depletion that occurs in three orthogonal directions: one direction parallel to current flow through a channel of a 3-D resurf drain extended MOSFET; and two directions perpendicular to the current flow. For example, in a 3-D resurf drain extended MOSFET in which current in the channel flows laterally (that is, parallel to a top surface of an integrated circuit containing the 3-D resurf drain extended MOSFET), depletion occurs laterally parallel to the current flow, laterally perpendicular to the current flow, and vertically perpendicular to the current flow. The terms "longitudinal" and "longitudinally" refer to directions parallel to current flow in the channel.

In one aspect, the invention provides an integrated circuit containing a configurable dual n-channel and p-channel high voltage drain extended MOSFET with 3-D resurf drift regions. In some embodiments, an NMOS transistor may be integrated with an n-channel backgate of the 3-D resurf drain extended MOSFET in series with an n-channel source region of the 3-D resurf drain extended MOSFET to form a cascode n-channel transistor. In other embodiments, a PMOS transistor may be integrated with a p-channel backgate of the 3-D resurf drain extended MOSFET in series with a p-channel source region of the 3-D resurf drain extended MOSFET to form a cascode p-channel transistor.

An embodiment of the integrated circuit containing the configurable dual n-channel and p-channel high voltage 3-D resurf drain extended MOSFET includes a circuit with alternately a high side load and a low side load. Use of the configurable dual n-channel and p-channel high voltage 3-D resurf drain extended MOSFET allows voltages to the high side load and the low side load to be regulated with less size and cost of the integrated circuit compared to regulation using discrete transistors. Another embodiment of the integrated circuit includes a circuit with a variable current load; use of the configurable dual n-channel and p-channel high voltage 3-D resurf drain extended MOSFET allows a voltage across the load to be regulated while maintaining low noise levels in both modes, with less size and cost of the integrated circuit compared to regulation using discrete transistors. A further embodiment of the integrated circuit includes a circuit with a variable voltage source applied to a load; use of the configurable dual n-channel and p-channel high voltage 3-D resurf drain extended MOSFET allows a voltage across the load to be regulated while maintaining low noise levels in both modes, with less size and cost of the integrated circuit compared to regulation using discrete transistors.

For the purpose of improving readability of this disclosure, the configurable dual n-channel and p-channel high voltage 3-D resurf drain extended MOSFET will herein be referred to as the configurable dual channel 3-D resurf drain extended MOSFET.

FIG. 1A depicts major elements of a configurable dual channel 3-D resurf drain extended MOSFET. An integrated circuit 1000 is formed in a substrate 1002 which is commonly a single crystal silicon wafer, but may be a silicon-on-insulator (SOI) wafer, a hybrid orientation technology (HOT) wafer with regions of different crystal orientations, or other material appropriate for fabrication of the integrated circuit 1000. A lateral drift region 1004 in the substrate 1002 includes n-type lateral drift lanes and p-type lateral drift lanes. A resurf region 1006 is formed in the substrate 1002 under and possibly laterally abutting the lateral drift region 1004.

An n-type well 1008 commonly known as an n-well, is formed in the substrate 1002 abutting the lateral drift region 1004. The n-well 1008 is formed for example by ion implanting an n-well set of n-type dopants, including phosphorus and arsenic, and possibly antimony, at doses from $1 \cdot 10^{11}$ to $1 \cdot 10^{14}$ atoms/cm$^2$, into a region defined for the n-well 1008. An n-well photoresist pattern, not shown in FIG. 1A for clarity, is commonly used to block the n-well set of n-type dopants from regions outside the n-well 1008. The n-well 1008 extends from the top surface of the substrate 1002 to a depth preferably between 400 to 1000 nanometers. The ion implantation process to form the n-well 1008 may include additional steps to implant additional n-type dopants at shallower depths for purposes of improving PMOS transistor performance, such as threshold adjustment, leakage current reduction and suppression of parasitic bipolar operation. Alternately, n-type dopants in the n-well 1008 may consist substantially of dopants already present in the substrate 1002. A sheet resistivity of the n-well 1008 is commonly between 100 and 1000 ohms/square.

A p-type well 1010 commonly known as a p-well, is formed in the substrate 1002 abutting the lateral drift region 1004 opposite the n-well 1008. The p-well 1010 is formed for example by ion implanting a p-well set of p-type dopants, including boron and possibly gallium and/or indium, at doses from $1 \cdot 10^{11}$ to $1 \cdot 10^{14}$ atoms/cm$^2$, into a region defined for the p-well 1010. A p-well photoresist pattern, not shown in FIG. 1A for clarity, is commonly used to block the p-well set of p-type dopants from regions outside the p-well 1010. The p-well 1010 extends from a top surface of the substrate 1002 to a depth typically between 350 and 800 nanometers. The ion implantation process to form the p-well 1010 may include additional steps to implant additional p-type dopants at shallower depths for purposes of improving NMOS transistor performance, such as threshold adjustment, leakage current reduction and suppression of parasitic bipolar operation. Alternately, p-type dopants in the p-well 1010 may consist substantially of dopants already present in the substrate 1002.

An n-channel drain and p-channel source region 1012 is formed in the n-well 1008 proximate to the lateral drift region 1004. N-channel drain elements of the n-channel drain and p-channel source region 1012 are formed for example by ion implanting an n-channel drain set of n-type dopants, including phosphorus and arsenic, and possibly antimony, at a total dose between $3 \cdot 10^{14}$ and $1 \cdot 10^{16}$ atoms/cm$^2$ into n-channel drain regions. An n-channel drain photoresist pattern, not shown in FIG. 1A for clarity, is used to block the n-channel drain set of n-type dopants from areas outside the n-channel drain regions. An n-channel drain anneal operation activates a portion of the n-type dopants in the n-channel drain implanted regions to form n-channel drain regions. The n-channel drain regions typically extend from the top surface of the n-well 1008 to a depth between 100 and 500 nanometers.

P-channel source elements of the n-channel drain and p-channel source region 1012 are formed for example by ion implanting a p-channel source set of p-type dopants, including boron, sometimes partly in the form $BF_2$, and possibly indium and/or gallium, at a total dose between $5 \cdot 10^{14}$ and $1 \cdot 10^{16}$ atoms/cm$^2$ into p-channel source implanted regions. A p-channel source photoresist pattern, not shown in FIG. 1A for clarity, is used to block the p-channel source set of p-type dopants from areas outside the p-channel source implanted regions. A p-channel source anneal operation activates a portion of the p-type dopants in the p-channel source implanted regions to form p-channel source regions. The p-channel source regions typically extend from the top surface of the n-well 1008 to a depth between 100 and 500 nanometers.

A p-channel drain and n-channel source region 1014 is formed in the p-well 1010 proximate to the lateral drift region 1004. P-channel drain elements of the p-channel drain and n-channel source region 1014 are formed by similar processes as, and are preferably formed concurrently with, the p-channel source elements of the n-channel drain and p-channel source region 1012. N-channel source elements of the p-channel drain and n-channel source region 1014 are formed by similar processes as, and are preferably formed concurrently with, the n-channel drain elements of the n-channel drain and p-channel source region 1012.

A p-channel drain extended MOS dielectric layer 1016 is formed on a top surface of the n-well 1008 adjacent to the n-channel drain and p-channel source region 1012 and overlapping a portion of the lateral drift region 1004. The p-channel MOS dielectric layer 1016 is formed for example of silicon dioxide, nitrogen doped silicon dioxide, silicon oxynitride, hafnium oxide, layers of silicon dioxide and silicon nitride, or other insulating material, and preferably between 1 and 50 nanometers thick, using any of a variety of gate dielectric formation process, for example thermal oxidation, plasma nitridation of an oxide layer, and/or dielectric material deposition by atomic layer deposition (ALD) processes.

An n-channel MOS dielectric layer 1018 is formed on a top surface of the p-well 1010 adjacent to the p-channel drain and n-channel source region 1014 and overlapping a portion of the lateral drift region 1004. The top surfaces of the p-well 1010 and the lateral drift region 1004 may have non-planar features, as depicted in FIG. 1A, which may advantageously increase a blocking voltage limit or decrease an on-state resistance for a given size of the configurable dual channel 3-D resurf drain extended MOSFET compared to a MOSFET of a same size without 3-D resurf depletion regions. In an alternate realization of the instant embodiment, a series resistance of the configurable dual channel 3-D resurf drain extended MOSFET may be reduced compared to a MOSFET of a same size without 3-D resurf depletion regions. The n-channel MOS dielectric layer 1018 is formed using similar processes and materials as the p-channel MOS dielectric layer 1016. A portion or all of the n-channel MOS dielectric layer 1018 may be formed concurrently with the p-channel MOS dielectric layer 1016. In one embodiment, the top surfaces of the n-well 1008 and the lateral drift region 1004 may have non-planar features.

A p-channel MOS gate 1020 is formed on a top surface of the p-channel MOS dielectric layer 1016. The p-channel MOS gate 1020 is formed for example of polycrystalline silicon, commonly known as polysilicon, between 50 to 300 nanometers thick, on a top surface of the p-channel MOS dielectric layer 1016, by depositing a layer of polysilicon on an existing top surface of the IC 1000, forming a p-channel gate photoresist pattern on a top surface of the polysilicon layer to define an area for the p-channel MOS gate 1020, and removing unwanted polysilicon using reactive ion etching methods.

An n-channel MOS gate 1022 is formed on a top surface of the p-channel MOS dielectric layer 1016. The n-channel MOS gate 1022 is formed using similar processes and materials as the p-channel MOS gate 1020. A portion or all of the n-channel MOS gate 1022 may be formed concurrently with the p-channel MOS gate 1020.

An n-channel drain and p-channel source distributed contact 1024 is formed on a top surface of the n-channel drain and p-channel source region 1012. The n-channel drain and p-channel source distributed contact 1024 may connect to the n-channel drain and p-channel source region 1012 at separate areas as depicted in FIG. 1A, or continuously across a width of the n-channel drain and p-channel source region 1012. A p-channel drain and n-channel source distributed contact 1026 is formed on a top surface of the p-channel drain and n-channel source region 1014. The p-channel drain and n-channel source distributed contact 1026 may connect to the p-channel drain and n-channel source region 1014 continuously as depicted in FIG. 1A, or at separate areas across a width of the n-channel drain and p-channel source region 1012.

Figure 2:
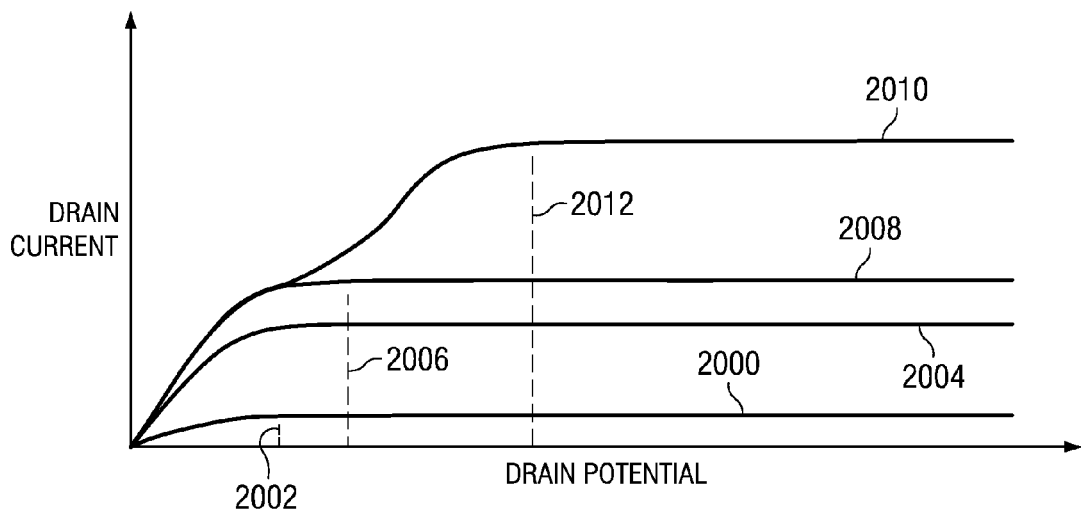
FIG. 2 shows drain current vs. drain potential for various modes of operation of the MOSFET depicted in FIGS. 1A and 1B.

The configurable dual channel 3-D resurf drain extended MOSFET depicted in FIG. 1A may be operated in a p-channel MOS mode, an n-channel MOS mode and dual channel modes in which both n-channel and p-channel elements conduct current, as depicted in FIG. 2. During the p-channel MOS mode operation, a p-channel drain potential is applied to the p-channel drain and n-channel source distributed contact 1026 and a p-channel source potential is applied to the n-channel drain and p-channel source distributed contact 1024. A p-channel gate potential is applied to the p-channel MOS gate 1020. A p-channel field plate potential is applied to the n-channel MOS gate 1022, which may be substantially equal to the p-channel source potential. P-channel drift lanes in the lateral drift region 1004 are depleted so as to reduce a potential difference across the p-channel MOS dielectric layer 1016. P-channel drain current 2000 increases as the p-channel drain potential increases, up to a PMOS saturation drain potential 2002. At p-channel drain potentials above the PMOS saturation drain potential 2002, the p-channel drain current 2000 is substantially constant.

During the n-channel MOS mode operation, an n-channel drain potential is applied to the n-channel drain and p-channel source distributed contact 1024 and an n-channel source potential is applied to the p-channel drain and n-channel source distributed contact 1026. An n-channel gate potential is applied to the n-channel MOS gate 1022. An n-channel field plate potential is applied to the p-channel MOS gate 1020, which may be substantially equal to the n-channel source potential. N-channel drift lanes in the lateral drift region 1004 are depleted so as to reduce a potential difference across the n-channel MOS dielectric layer 1018. N-channel drain current 2004 increases as the n-channel drain potential increases, up to an NMOS saturation drain potential 2006. At n-channel drain potentials above the NMOS saturation drain potential 2006, the n-channel drain current 2004 is substantially constant.

During the dual channel MOS mode of operation, a drain potential is applied to the n-channel drain and p-channel source distributed contact 1024, and a source potential is applied to the p-channel drain and n-channel source distributed contact 1026. The drain potential is more positive than the source potential. An n-channel gate potential is applied to the n-channel MOS gate 1022 and a p-channel gate potential is applied to the p-channel MOS gate 1020. The n-channel gate potential is more positive than the the source potential and the p-channel gate potential is less positive than the drain potential. Dual channel MOS drain current 2008 is conducted through both n-type drift lanes and p-type drift lanes. The dual channel MOS drain current 2008 increases from zero as the drain potential increases from zero. At drain potentials above the PMOS saturation drain potential 2002 and the the NMOS saturation drain potential 2006, the dual channel MOS drain current 2008 is substantially constant.

In a dual MOS bipolar enhanced mode, current may flow across boundaries between the n-type drift lanes and p-type drift lanes providing bipolar enhancement to the current in a manner similar to a coupled npn/pnp bipolar transistor device that increases the total drain current to a value more than a sum of drain currents in the n-channel mode and p-channel mode separately. A dual MOS bipolar enhanced drain current 2010 increases from zero as the drain potential increases from zero. At drain potentials above a dual MOS bipolar enhanced saturation drain potential 2012, the dual MOS bipolar enhanced drain current 2010 is substantially constant.

Figure 1B:
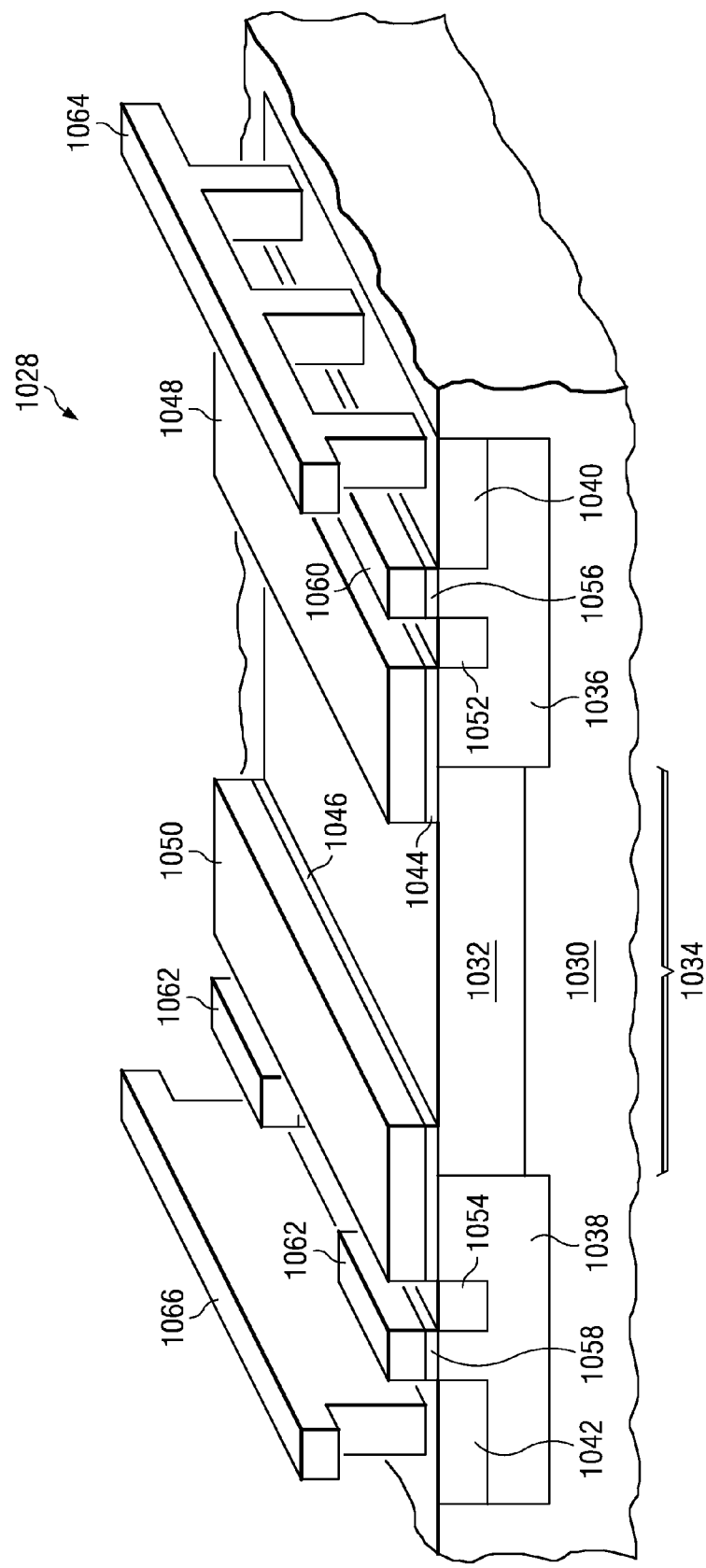

FIG. 1B depicts major elements of a configurable dual channel 3-D resurf drain extended MOSFET with an NMOS transistor integrated into an n-channel source region in a n-channel cascode configuration and a PMOS transistor integrated into a p-channel source region in a p-channel cascode configuration. An integrated circuit 1028 is formed in a substrate 1030 as described in reference to FIG. 1A. A lateral drift region 1032 in the substrate 1030 includes n-type lateral drift lanes and p-type lateral drift lanes. A bottom resurf region 1034 is formed in the substrate 1030 under the lateral drift region 1032. An n-well 1036 is formed in the substrate 1030, as described in reference to FIG. 1A, abutting the lateral drift region 1032. A p-well 1038 is formed in the substrate 1030, as described in reference to FIG. 1A, abutting the lateral drift region 1032 opposite the n-well 1036. An n-channel drain and p-channel source region 1040 is formed, as described in reference to FIG. 1A, in the n-well 1036 proximate to the lateral drift region 1032. A p-channel drain and n-channel source region 1042 is formed in the p-well 1038 proximate to the lateral drift region 1032. P-channel drain elements of the p-channel drain and n-channel source region 1042 are formed by similar processes as, and are preferably formed concurrently with, p-channel source elements of the n-channel drain and p-channel source region 1040. N-channel source elements of the p-channel drain and n-channel source region 1042 are formed by similar processes as, and are preferably formed concurrently with, n-channel drain elements of the n-channel drain and p-channel source region 1040. A p-channel MOS dielectric layer 1044 is formed, as described in reference to FIG. 1A, on a top surface of the n-well 1036 and a top surface of the lateral drift region 1032. An n-channel MOS dielectric layer 1046 is formed, as described in reference to FIG. 1A, on a top surface of the p-well 1038 and a top surface of the lateral drift region 1032. A p-channel MOS gate 1048 is formed, as described in reference to FIG. 1A, on a top surface of the p-channel MOS dielectric layer 1044. An n-channel MOS gate 1050 is formed, as described in reference to FIG. 1A, on a top surface of the n-channel MOS dielectric layer 1046.

A p-type PMOS cascode drain region 1052 is formed in the n-well 1036 adjacent to the p-channel MOS gate 1048. The PMOS cascode drain region 1052 may be formed by similar processes as, and are preferably formed concurrently with, p-channel source elements of the n-channel drain and p-channel source region 1040. An n-type NMOS cascode drain region 1054 is formed in the p-well 1038 adjacent to the n-channel MOS gate 1050. The NMOS cascode drain region 1054 may be formed by similar processes as, and are preferably formed concurrently with, n-channel source elements of the p-channel drain and n-channel source region 1042.

A PMOS cascode dielectric layer 1056 is formed on a top surface of the n-well 1036, between the PMOS cascode drain region 1052 and the n-channel drain and p-channel source region 1040. The PMOS cascode dielectric layer 1056 is formed using similar processes and materials as, and may be formed concurrently with, the p-channel MOS dielectric layer 1044.

An NMOS cascode dielectric layer 1058 is formed on a top surface of the p-well 1038, between the NMOS cascode drain region 1054 and the p-channel drain and n-channel source region 1042. The NMOS cascode dielectric layer 1058 is formed using similar processes and materials as, and may be formed concurrently with, the n-channel MOS dielectric layer 1046.

A PMOS cascode gate 1060 is formed on a top surface of the PMOS cascode dielectric layer 1056. The PMOS cascode gate 1060 is formed using similar processes and materials as, and may be formed concurrently with, the p-channel MOS gate 1048.

An NMOS cascode gate 1062 is formed on a top surface of the NMOS cascode dielectric layer 1058. The NMOS cascode gate 1062 is formed using similar processes and materials as, and may be formed concurrently with, the n-channel MOS gate 1050.

The PMOS cascode gate 1060 and NMOS cascode gate 1062 may be continuous across a width of the configurable dual channel 3-D resurf drain extended MOSFET, as depicted for the PMOS cascode gate 1060 in FIG. 1B, or may be segmented, as depicted for the NMOS cascode gate 1062 in FIG. 1B.

An n-channel drain and p-channel source distributed contact 1064 is formed on a top surface of the n-channel drain and p-channel source region 1040 proximate to the PMOS cascode gate 1060 and opposite the p-channel MOS gate 1048. The n-channel drain and p-channel source distributed contact 1064 may connect to the n-channel drain and p-channel source region 1040 at separate areas as depicted in FIG. 1B, or continuously across a width of the n-channel drain and p-channel source region 1040. A p-channel drain and n-channel source distributed contact 1066 is formed on a top surface of the p-channel drain and n-channel source region 1042 proximate to the NMOS cascode gate 1062 and opposite the n-channel MOS gate 1050. The p-channel drain and n-channel source distributed contact 1066 may connect to the p-channel drain and n-channel source region 1042 continuously as depicted in FIG. 1B, or at separate areas across a width of the p-channel drain and n-channel source region 1042.

The configurable dual channel 3-D resurf drain extended MOSFET with NMOS and PMOS cascode transistors depicted in FIG. 1B may be operated in a p-channel mode, an n-channel mode, a dual MOS mode and a dual MOS bipolar enhanced mode. During p-channel mode operation, a p-channel drain potential is applied to the p-channel drain and n-channel source distributed contact 1066 and a p-channel source potential is applied to the n-channel drain and p-channel source distributed contact 1064. A p-channel gate potential is applied to the p-channel MOS gate 1048 and the PMOS cascode gate 1060. A p-channel field plate potential is applied to the n-channel MOS gate 1050. P-channel drift lanes in the lateral drift region 1032 are depleted so as to reduce a potential difference across the p-channel MOS dielectric layer 1044. A parasitic pnp bipolar transistor in the substrate 1030 under the p-channel MOS gate 1048 is desirably debiased by the PMOS cascode transistor. P-channel drain current 2000 increases as the p-channel drain potential increases, up to a PMOS saturation drain potential 2002. At p-channel drain potentials above the PMOS saturation drain potential 2002, the p-channel drain current 2000 is substantially constant.

During n-channel mode operation, an n-channel drain potential is applied to the n-channel drain and p-channel source distributed contact 1064 and an n-channel source potential is applied to the p-channel drain and n-channel source distributed contact 1066. An n-channel gate potential is applied to the n-channel MOS gate 1050 and the NMOS cascode gate 1062. An n-channel field plate potential is applied to the p-channel MOS gate 1048. N-channel drift lanes in the lateral drift region 1032 are depleted so as to reduce a potential difference across the n-channel MOS dielectric layer 1046. A parasitic npn bipolar transistor in the substrate 1030 under the n-channel MOS gate 1050 is desirably debiased by the NMOS cascode transistor. N-channel drain current 2004 increases as the n-channel drain potential increases, up to an NMOS saturation drain potential 2006. At n-channel drain potentials above the NMOS saturation drain potential 2006, the n-channel drain current 2004 is substantially constant.

During the dual channel MOS mode of operation, a drain potential is applied to the n-channel drain and p-channel source distributed contact 1064 and a source potential is applied to the p-channel drain and n-channel source distributed contact 1066. The drain potential is more positive than the source potential. A p-channel gate potential is applied to the p-channel MOS gate 1048 and the PMOS cascode gate 1060. An n-channel gate potential is applied to the n-channel MOS gate 1050 and the NMOS cascode gate 1062. Dual channel MOS drain current 2008 is conducted through both n-type drift lanes and p-type drift lanes. The dual channel MOS drain current 2008 increases from zero as the drain potential increases from zero. At drain potentials above the PMOS saturation drain potential 2002 and the the NMOS saturation drain potential 2006, the dual channel MOS drain current 2008 is substantially constant. A dual MOS bipolar enhanced mode behaves as described in reference to FIGS. 1A and 2.

The configurable dual channel 3-D resurf drain extended MOSFET with NMOS and PMOS cascode transistors depicted in FIG. 1B may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

In an alternate embodiment, a configurable dual channel 3-D resurf drain extended MOSFET may be formed with an NMOS cascode transistor, free of a PMOS cascode transistor. In another embodiment, a configurable dual channel 3-D resurf drain extended MOSFET may be formed with a PMOS cascode transistor, free of an NMOS cascode transistor.

FIGS. 3A-3J illustrate embodiments of lateral drift regions in configurable dual channel 3-D resurf drain extended MOSFETs. N-channel drain and p-channel source regions, and p-channel drain and n-channel source regions, as described in reference to FIG. 1A and FIG. 1B, are not depicted in FIG. 3A through FIG. 3J to assist comprehension of the figures. MOS dielectric layers and MOS gates, as described in reference to FIG. 1A and FIG. 1B, are not depicted in FIG. 3A through FIG. 3J to further assist comprehension of the figures.

Figure 3A:
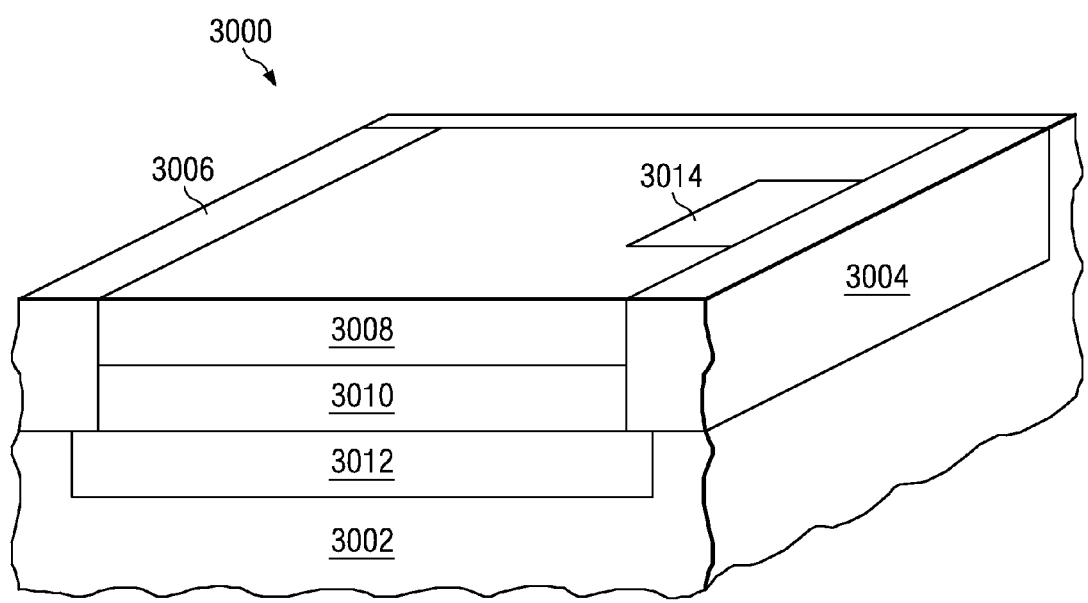
FIGS. 3A-3I are perspective section views and FIG. 3J is a plan view of integrated circuits including embodiments of lateral drift regions in configurable dual channel 3-D resurf drain extended MOSFETs according to principles of the invention.

FIG. 3A depicts a first embodiment of a lateral drift region in a configurable dual channel 3-D resurf drain extended MOSFET. An integrated circuit 3000 is formed in a substrate 3002 as described in reference to FIG. 1A. An n-well 3004 and a p-well 3006 are formed in the substrate 3002 as described in reference to FIG. 1A. A lateral drift region between the n-well 3004 and the p-well 3006 includes an n-type drift lane 3008 formed at a top region of the substrate 3002 extending longitudinally to the n-well 3004 and the p-well 3006 across a width of the configurable dual channel 3-D resurf drain extended MOSFET. In one realization of the instant embodiment, a doping density of the n-type drift lane 3008 is between $1 \cdot 10^{14}$ cm$^{-3}$ and $1 \cdot 10^{18}$ cm$^{-3}$. The lateral drift region further includes a p-type drift lane 3010 formed under the n-type drift lane 3008, contacting a bottom surface of the n-type drift lane 3008, extending longitudinally to the n-well 3004 and the p-well 3006 across a width of the configurable dual channel 3-D resurf drain extended MOSFET. In one realization of the instant embodiment, a doping density of the p-type drift lane 3010 is between $1 \cdot 10^{14}$ cm$^{-3}$ and $1 \cdot 10^{18}$ cm$^{-3}$. An n-type bottom resurf region 3012 is formed in the substrate 3002 under the p-type drift lane 3010. A p-channel drain well 3014 is formed in the substrate 3002 against the n-well 3004 and extending from a top surface of the substrate to the p-type drift lane 3010. In alternate embodiments, additional p-channel drain wells may be formed along the width of the configurable dual channel 3-D resurf drain extended MOSFET.

The configurable dual channel 3-D resurf drain extended MOSFET of the instant embodiment may be electrically isolated from other components in the integrated circuit 3000 by any combination of field oxide, elements of deep trench isolation, pn junctions, a buried oxide layer, buried doped layers, or other means.

During operation in a p-channel mode, the p-type drift lane 3010 is longitudinally depleted so as to reduce a potential difference across the n-well 3004 at the top surface of the substrate 3002. The drain p-well 3014 contacts a p-channel inversion region (not shown) under a p-channel MOS gate (not shown) over the n-well 3004 and carries a p-channel drain current from the p-type drift lane 3010 to the p-channel inversion region. The n-type drift lane 3008 acts as a resurf region on a top surface of the p-type drift lane 3010. The n-type drift lane 3008 and the bottom resurf region 3012 cause the p-type drift lane 3010 to be depleted from above and below so as to desirably reduce an electric field between the drain p-well 3014 and the n-well 3004. The configurable dual channel 3-D resurf drain extended MOSFET of the instant embodiment may be advantageously operated in the p-channel mode at a higher bias than a p-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

During operation in an n-channel mode, the n-type drift lane 3008 is longitudinally depleted so as to reduce a potential difference across the p-well 3006 at the top surface of the substrate 3002. The p-type drift lane 3010 provides a resurf region on a bottom surface of the n-type drift lane 3008, causing the n-type drift lane 3008 to be depleted from below so as to desirably reduce an electric field between the n-type drift lane 3008 and the p-well 3006. Biasing a p-channel MOS gate (not shown) so as to further deplete a region in the n-type drift lane 3008 under the p-channel MOS gate advantageously reduces a surface electric field at a junction between the n-type drift lane 3008 and the p-well 3006, allowing a higher drain potential to be applied. The configurable dual channel 3-D resurf drain extended MOSFET of the instant embodiment may be advantageously operated in the n-channel mode at a higher bias than an n-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

The configurable dual channel 3-D resurf drain extended MOSFET depicted in FIG. 3A may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

The configurable dual channel 3-D resurf drain extended MOSFET depicted in FIG. 3A may also be operated in a dual MOS mode and a dual MOS bipolar enhanced mode, as described in reference to FIG. 2.

In an alternate embodiment, the p-type drift lane 3010 may be formed at the top region of the substrate 3002 with the n-type drift lane 3008 formed under and contacting the p-type drift lane 3010. The drain p-well 3014 would be replaced with a drain n-well formed adjacent to and contacting the p-well 3006. A polarity of the bottom resurf region 3012 would be changed to p-type. The advantages discussed above of operating the configurable dual channel 3-D resurf drain extended MOSFET at high voltages may be obtained in the instant embodiment.

Figure 3B:
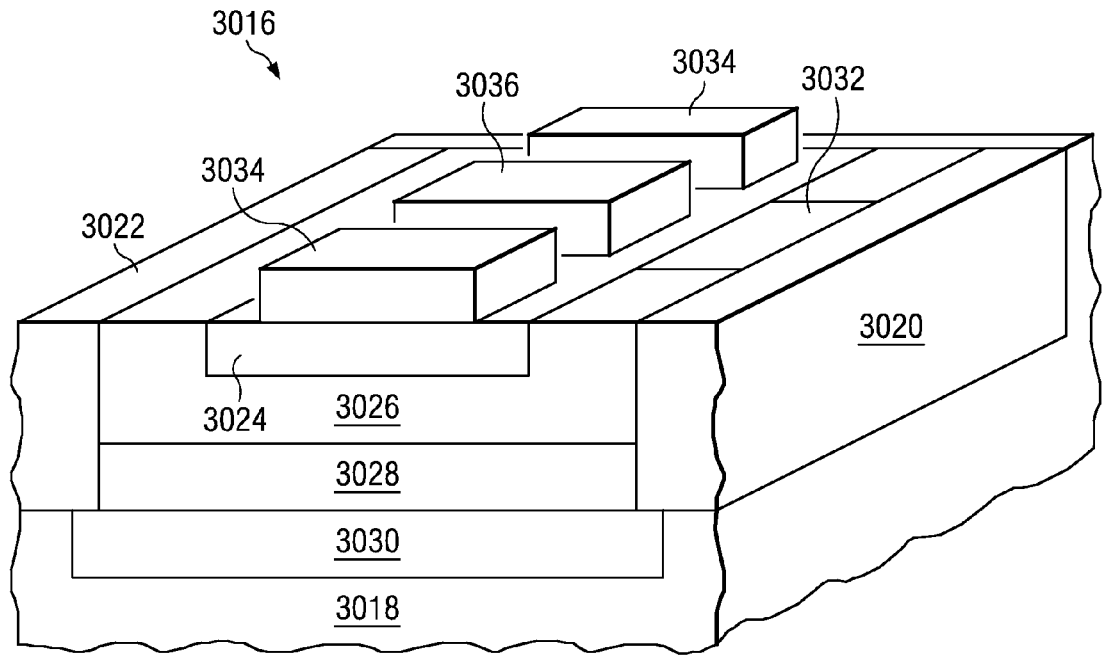

FIG. 3B depicts a second embodiment of a lateral drift region in a configurable dual channel 3-D resurf drain extended MOSFET. An integrated circuit 3016 is formed in a substrate 3018 as described in reference to FIG. 1A. An n-well 3020 and a p-well 3022 are formed in the substrate 3018 as described in reference to FIG. 1A. A lateral drift region between the n-well 3020 and the p-well 3022 includes a field oxide layer 3024 which extends across a width of the configurable dual channel 3-D resurf drain extended MOSFET. The field oxide layer 3024 does not contact the n-well 3020 or the p-well 3022 across a full width of the n-well 3020 or the p-well 3022, if at all. The lateral drift region further includes an n-type drift lane 3026 formed under the field oxide layer 3024 and at a top surface of the substrate 3018 between the field oxide layer 3024 and the n-well 3020 and between the field oxide layer 3024 the p-well 3022, extending longitudinally from the n-well 3020 to the p-well 3022. In one realization of the instant embodiment, a doping density of the n-type drift lane 3026 is between $1 \cdot 10^{14}$ cm$^{-3}$ and $1 \cdot 10^{18}$ cm$^{-3}$. The lateral drift region also includes a p-type drift lane 3028 formed under, and contacting, the n-type drift lane 3026, extending longitudinally to the n-well 3020 and the p-well 3022 across a width of the configurable dual channel 3-D resurf drain extended MOSFET. In one realization of the instant embodiment, a doping density of the p-type drift lane 3028 is between $1 \cdot 10^{14}$ cm$^3$ and $1 \cdot 10^{18}$ cm$^{-3}$. An n-type bottom resurf region 3030 is formed in the substrate 3018 under the p-type drift lane 3028. A p-channel drain p-well 3032 is formed in the substrate 3018 against the n-well 3020 and extending from a top surface of the substrate to the p-type drift lane 3028. In alternate embodiments, additional p-channel drain p-wells may be formed along the width of the configurable dual channel 3-D resurf drain extended MOSFET. An optional n-channel field plate 3034 and/or an optional p-channel field plate 3036 may be formed on a top surface of the field oxide layer 3024 over the n-type drift lane 3026 and the p-type drift lane 3028, respectively. The n-channel field plate 3034 and p-channel field plate 3036 if present may have same lengths as depicted in FIG. 3B or different lengths, and may be arranged in an aligned configuration as depicted in FIG. 3B or in a staggered configuration. The n-channel field plate 3034 may be directly connected to an NMOS gate (not shown) of the configurable dual channel 3-D resurf drain extended MOSFET or may be connected to an n-channel field plate bias circuit. Similarly, the p-channel field plate 3036 may be directly connected to a PMOS gate (not shown) of the configurable dual channel 3-D resurf drain extended MOSFET or may be connected to a p-channel field plate bias circuit. In an alternate realization of the instant embodiment, the n-channel field plate 3034 may extend across the n-type drift lane 3026 and the p-type drift lane 3028, proximate to the NMOS gate of the configurable dual channel 3-D resurf drain extended MOSFET, and the p-channel field plate 3036 may extend across the n-type drift lane 3026 and the p-type drift lane 3028, proximate to the PMOS gate of the configurable dual channel 3-D resurf drain extended MOSFET.

The configurable dual channel 3-D resurf drain extended MOSFET of the instant embodiment may be electrically isolated from other components in the integrated circuit 3016 by field oxide, elements of deep trench isolation, pn junctions or other means.

During operation in a p-channel mode, the p-type drift lane 3028 is longitudinally depleted so as to reduce a potential difference across the n-well 3020 at the top surface of the substrate 3018. The presence of the field oxide layer 3024 reduces an electric field at an edge of a p-channel MOS gate (not shown) over the p-type drift lane 3028 and allows operation of the p-channel field plate 3036 which may deplete the p-type drift lane 3028 from a top direction, advantageously allowing a high blocking voltage to be applied to the configurable dual channel 3-D resurf drain extended MOSFET of the instant embodiment compared to embodiments without a field oxide layer in the lateral drift region. In an alternate realization of the instant embodiment, a series resistance of the configurable dual channel 3-D resurf drain extended MOSFET may be reduced compared to a MOSFET of a same size without 3-D resurf depletion regions. The drain p-well 3032 contacts a p-channel inversion region (not shown) under the p-channel MOS gate (not shown) over the n-well 3020 and carries a p-channel drain current from the p-type drift lane 3028 to the p-channel inversion region. The n-type drift lane 3026 acts as a resurf region on a top surface of the p-type drift lane 3028. The n-type drift lane 3026 and the bottom resurf region 3030 cause the p-type drift lane 3028 to be depleted from above and below so as to desirably reduce an electric field between the drain p-well 3032 and the n-well 3020, as described in reference to FIG. 3A. The configurable dual channel 3-D resurf drain extended MOSFET of the instant embodiment may be advantageously operated in the p-channel mode at a higher bias than a p-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

During operation in an n-channel mode, the n-type drift lane 3026 is longitudinally depleted so as to reduce a potential difference across the p-well 3022 at the top surface of the substrate 3018. The presence of the field oxide layer 3024 reduces an electric field at an edge of an n-channel MOS gate (not shown) over the n-type drift lane 3026 and allows operation of the n-channel field plate 3034 which may deplete the n-type drift lane 3026 from a top direction, advantageously allowing a high blocking voltage to be applied to the configurable dual channel 3-D resurf drain extended MOSFET of the instant embodiment compared to embodiments without a field oxide layer in the lateral drift region. In an alternate realization of the instant embodiment, a series resistance of the configurable dual channel 3-D resurf drain extended MOSFET may be reduced compared to a MOSFET of a same size without 3-D resurf depletion regions. The p-type drift lane 3028 provides a resurf region on a bottom surface of the n-type drift lane 3026, causing the n-type drift lane 3026 to be depleted from below so as to desirably reduce an electric field between the n-type drift lane 3026 and the p-well 3022. The field oxide layer 3024 further reduces an electric field between the n-type drift lane 3026 and the p-well 3022. Biasing the p-channel MOS gate (not shown) so as to further deplete a region in the n-type drift lane 3026 under the p-channel MOS gate advantageously reduces a surface electric field at a junction between the n-type drift lane 3026 and the p-well 3022, allowing a higher drain potential to be applied. The configurable dual channel 3-D resurf drain extended MOSFET of the instant embodiment may be advantageously operated in the n-channel mode at a higher bias than an n-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

The configurable dual channel 3-D resurf drain extended MOSFET depicted in FIG. 3B may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

Figure 3C:
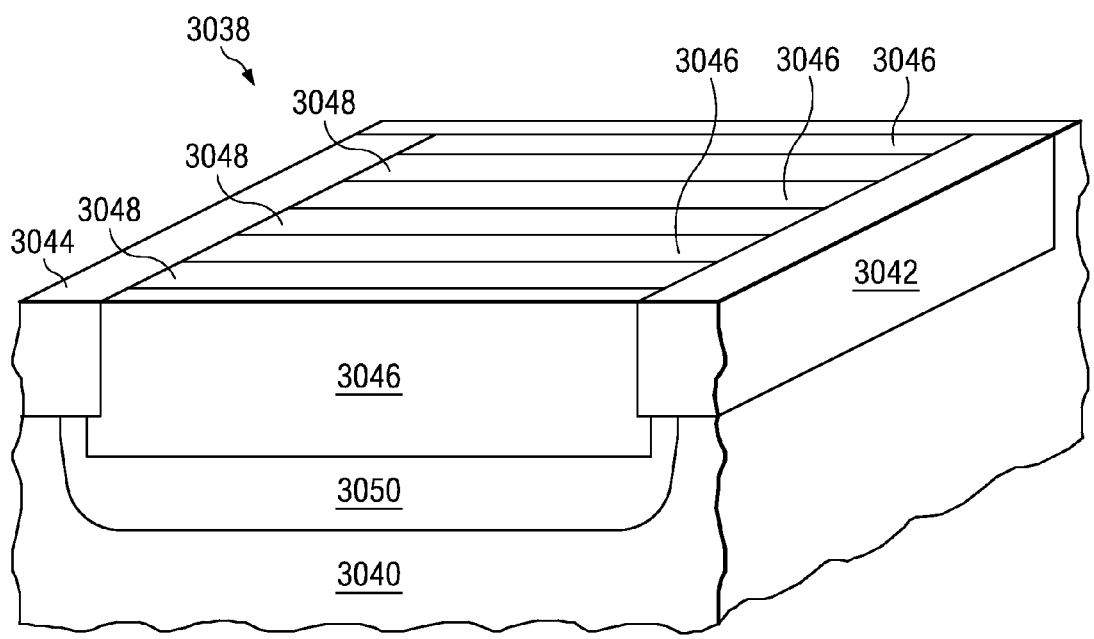

FIG. 3C depicts a third embodiment of a lateral drift region in a configurable dual channel 3-D resurf drain extended MOSFET. An integrated circuit 3038 is formed in a p-type substrate 3040 as described in reference to FIG. 1A. An n-well 3042 and a p-well 3044 are formed in the substrate 3040 as described in reference to FIG. 1A. A lateral drift region between the n-well 3042 and the p-well 3044 includes alternating n-type drift lanes 3046 and p-type drift lanes 3048, both of which extend longitudinally from the n-well 3042 to the p-well 3044. The alternating n-type drift lanes 3046 and p-type drift lanes 3048 may extend below the n-well 3042 and the p-well 3044 as depicted in FIG. 3C, or may be shallower than the n-well 3042 and the p-well 3044. In one realization of the instant embodiment, a doping density of the n-type drift lanes 3046 and the p-type drift lanes 3048 is between $1 \cdot 10^{14}$ cm$^{-3}$ and $1 \cdot 10^{18}$ cm$^{-3}$. A bottom n-type resurf region 3050 is formed under the alternating n-type drift lanes 3046 and p-type drift lanes 3048. In one realization of the instant embodiment, the n-type drift lanes 3046 or the p-type drift lanes 3048 may be formed by etching trenches in the lateral drift region and subsequently growing semiconductor material in the trenches using an epitaxial process. The trenches may be formed for example by a deep trench process.

The configurable dual channel 3-D resurf drain extended MOSFET of the instant embodiment may be electrically isolated from other components in the integrated circuit 3038 by field oxide, elements of deep trench isolation, pn junctions or other means.

During operation in a p-channel mode, the p-type drift lanes 3048 are longitudinally depleted so as to reduce a potential difference across the n-well 3042 at the top surface of the substrate 3040. The n-type drift lanes 3046 act as resurf regions on lateral surfaces of the p-type drift lanes 3048. The n-type drift lanes 3046 and the bottom resurf region 3050 cause the p-type drift lanes 3048 to be depleted from each side and from below so as to desirably reduce electric fields between the p-type drift lanes 3048 and the n-well 3042, as described in reference to FIG. 3A. Biasing an n-channel MOS gate (not shown) so as to further deplete regions in the p-type drift lanes 3048 under the n-channel MOS gate advantageously reduces surface electric fields at junctions between the p-type drift lane 3048 and the n-well 3042, allowing a higher drain potential to be applied. The configurable dual channel 3-D resurf drain extended MOSFET of the instant embodiment may be advantageously operated in the p-channel mode at a higher bias than a p-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

During operation in an n-channel mode, the n-type drift lanes 3046 are longitudinally depleted so as to reduce a potential difference across the p-well 3044 at the top surface of the substrate 3040. The p-type drift lanes 3048 and p-type substrate 3040 provide resurf regions on lateral surfaces of the n-type drift lanes 3046, causing the n-type drift lanes 3046 to be depleted from each side, from above and from below so as to desirably reduce electric fields between the n-type drift lane 3046 and the p-well 3044. Biasing a p-channel MOS gate (not shown) so as to further deplete regions in the n-type drift lanes 3046 under the p-channel MOS gate advantageously reduces surface electric fields at junctions between the n-type drift lanes 3046 and the p-well 3044, allowing a higher drain potential to be applied. The configurable dual channel 3-D resurf drain extended MOSFET of the instant embodiment may be advantageously operated in the n-channel mode at a higher bias than an n-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

The configurable dual channel 3-D resurf drain extended MOSFET depicted in FIG. 3C may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

Figure 3D:
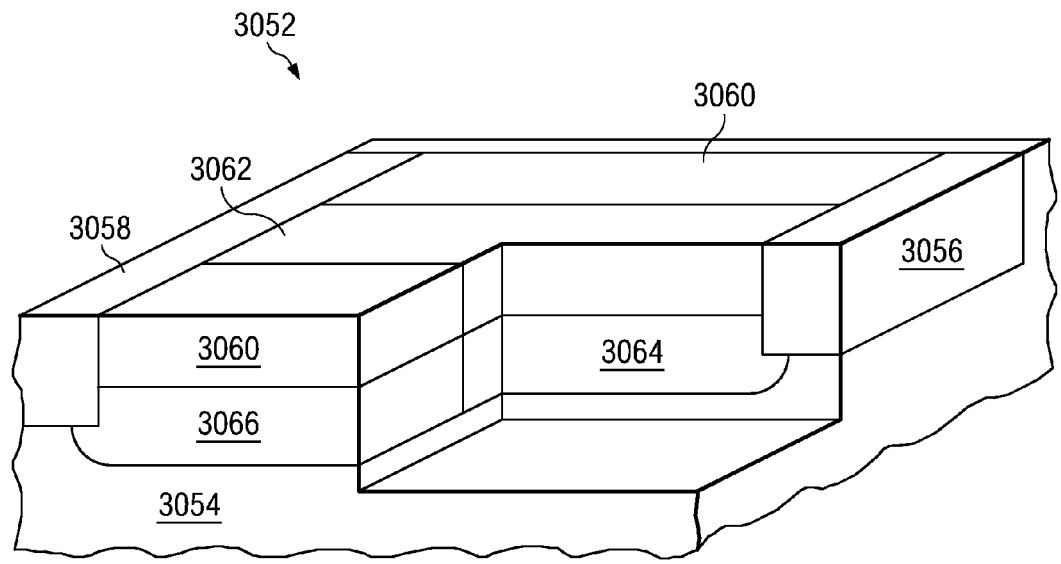

FIG. 3D depicts a fourth embodiment of a lateral drift region in a configurable dual channel 3-D resurf drain extended MOSFET. An integrated circuit 3052 is formed in a p-type substrate 3054 as described in reference to FIG. 1A. An n-well 3056 and a p-well 3058 are formed in the substrate 3054 as described in reference to FIG. 1A. A lateral drift region between the n-well 3056 and the p-well 3058 includes alternating n-type drift lanes 3060 and p-type drift lanes 3062, both of which extend longitudinally from the n-well 3056 to the p-well 3058. In one realization of the instant embodiment, a doping density of the n-type drift lanes 3060 and the p-type drift lanes 3062 is between $1 \cdot 10^{14}$ cm$^{-3}$ and $1 \cdot 10^{18}$ cm$^{-3}$. The p-type drift lanes 3062 may be formed by growing epitaxial layers in trenches formed in the lateral drift region. Bottom n-type resurf regions 3064 are formed under the p-type drift lanes 3048, and bottom p-type resurf regions 3066 are formed under the n-type drift lanes 3046. In an alternate realization of the instant embodiment, a buffer layer (not shown) of an opposite conductivity type from the substrate 3054 may be formed between the substrate 3054 and the resurf regions 3064 and 3066.

The configurable dual channel 3-D resurf drain extended MOSFET of the instant embodiment may be electrically isolated from other components in the integrated circuit 3052 by field oxide, elements of deep trench isolation, pn junctions or other means.

During operation in a p-channel mode, the p-type drift lanes 3062 are longitudinally depleted so as to reduce a potential difference across the n-well 3056 at the top surface of the substrate 3054. The n-type drift lanes 3060 act as resurf regions on lateral surfaces of the p-type drift lanes 3062. The n-type drift lanes 3060 and the n-type bottom resurf regions 3064 cause the p-type drift lanes 3062 to be depleted from each side and from below so as to desirably reduce electric fields between the p-type drift lanes 3062 and the n-well 3056, as described in reference to FIG. 3A. Biasing an n-channel MOS gate (not shown) so as to further deplete regions in the p-type drift lanes 3062 under the n-channel MOS gate advantageously reduces surface electric fields at junctions between the p-type drift lane 3062 and the n-well 3056, allowing a higher drain potential to be applied. The configurable dual channel 3-D resurf drain extended MOSFET of the instant embodiment may be advantageously operated in the p-channel mode at a higher bias than a p-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

During operation in an n-channel mode, the n-type drift lanes 3060 are longitudinally depleted so as to reduce a potential difference across the p-well 3058 at the top surface of the substrate 3054. The p-type drift lanes 3062 and the p-type bottom resurf regions 3066 provide resurf regions on lateral and bottom surfaces of the n-type drift lanes 3060, causing the n-type drift lanes 3060 to be depleted from each side and from below so as to desirably reduce electric fields between the n-type drift lane 3060 and the p-well 3058. Biasing a p-channel MOS gate (not shown) so as to further deplete regions in the n-type drift lanes 3060 under the p-channel MOS gate advantageously reduces surface electric fields at junctions between the n-type drift lanes 3060 and the p-well 3058, allowing a higher drain potential to be applied. The configurable dual channel 3-D resurf drain extended MOSFET of the instant embodiment may be advantageously operated in the n-channel mode at a higher bias than an n-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

The configurable dual channel 3-D resurf drain extended MOSFET depicted in FIG. 3D may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

Figure 3E:
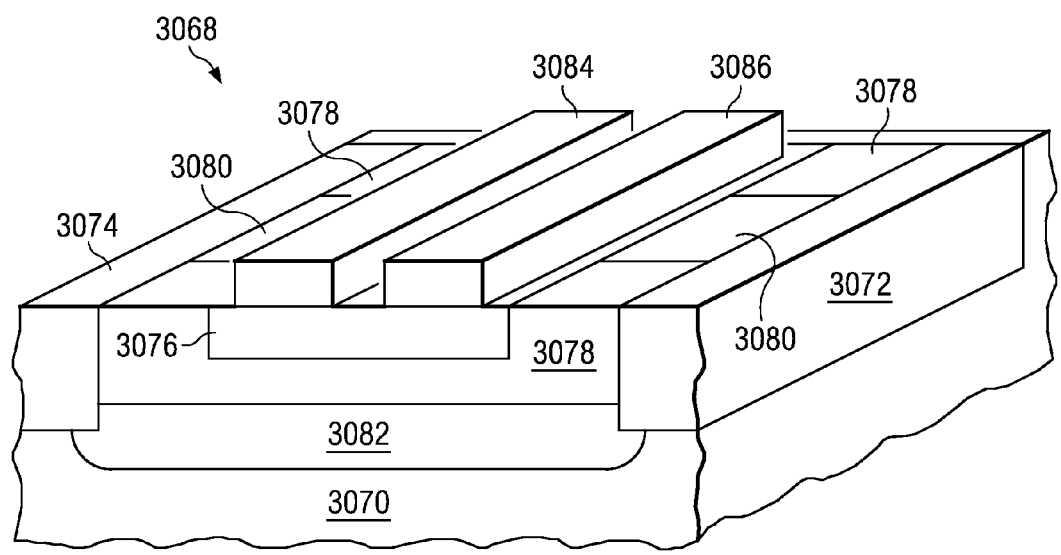

FIG. 3E depicts a fifth embodiment of a lateral drift region in a configurable dual channel 3-D resurf drain extended MOSFET. An integrated circuit 3068 is formed in a substrate 3070 as described in reference to FIG. 1A. An n-well 3072 and a p-well 3074 are formed in the substrate 3070 as described in reference to FIG. 1A. A lateral drift region between the n-well 3072 and the p-well 3074 includes a field oxide layer 3076 which extends across a width of the configurable dual channel 3-D resurf drain extended MOSFET. The field oxide layer 3076 does not contact the n-well 3072 or the p-well 3074 across a full width of the n-well 3072 or the p-well 3074, if at all. The lateral drift region further includes alternating n-type drift lanes 3078 and p-type drift lanes 3080, both of which extend longitudinally under the field oxide layer 3076 from the n-well 3072 to the p-well 3074. In one realization of the instant embodiment, a doping density of the n-type drift lanes 3078 and the p-type drift lanes 3080 is between $1 \cdot 10^{14}$ cm$^{-3}$ and $1 \cdot 10^{18}$ cm$^{-3}$. A bottom resurf region 3082 is formed under the alternating n-type drift lanes 3078 and p-type drift lanes 3080, with appropriate conductivity under each drift region. An optional n-channel field plate 3084 may be formed on a top surface of the field oxide layer 3076 extending across the n-type drift lanes 3078 and the p-type drift lanes 3080, proximate to an NMOS gate (not shown) of the configurable dual channel 3-D resurf drain extended MOSFET. Similarly, an optional p-channel field plate 3086 may be formed on a top surface of the field oxide layer 3076 extending across the n-type drift lanes 3078 and the p-type drift lanes 3080, proximate to a PMOS gate (not shown) of the configurable dual channel 3-D resurf drain extended MOSFET. The n-channel field plate 3084 may be directly connected to the NMOS gate of the configurable dual channel 3-D resurf drain extended MOSFET or may be connected to an n-channel field plate bias circuit. Similarly, the p-channel field plate 3086 may be directly connected to the PMOS gate of the configurable dual channel 3-D resurf drain extended MOSFET or may be connected to a p-channel field plate bias circuit. In an alternate realization of the instant embodiment, the n-channel field plate 3084 and the p-channel field plate 3086 may be configured as described in reference to FIG. 3B.

The configurable dual channel 3-D resurf drain extended MOSFET of the instant embodiment may be electrically isolated from other components in the integrated circuit 3068 by field oxide, elements of deep trench isolation, pn junctions or other means.

During operation in a p-channel mode, the p-type drift lanes 3080 are longitudinally depleted so as to reduce a potential difference across the n-well 3072 at the top surface of the substrate 3070. The n-type drift lanes 3078 act as resurf regions on lateral surfaces of the p-type drift lanes 3080. The n-type drift lanes 3078 and the bottom resurf region 3082 cause the p-type drift lanes 3080 to be depleted from each side and from below so as to desirably reduce an electric field between the p-type drift lanes 3080 and the n-well 3072, as described in reference to FIG. 3A. The p-channel field plate 3086 may be biased so as to further reduce an electric field between the p-type drift lanes 3080 and the n-well 3072. Biasing the n-channel MOS gate (not shown) so as to further deplete a region in the p-type drift lanes 3080 under the n-channel MOS gate advantageously reduces a surface electric field at a junction between the p-type drift lanes 3080 and the n-well 3072, allowing a higher drain potential to be applied. The configurable dual channel 3-D resurf drain extended MOSFET of the instant embodiment may be advantageously operated in the p-channel mode at a higher bias than a p-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

During operation in an n-channel mode, the n-type drift lanes 3078 are longitudinally depleted so as to reduce a potential difference across the p-well 3074 at the top surface of the substrate 3070. The p-type drift lanes 3080 provide resurf regions on lateral surfaces of the n-type drift lanes 3078, causing the n-type drift lanes 3078 to be depleted from each side and from below so as to desirably reduce an electric field between the n-type drift lanes 3078 and the p-well 3074. The n-channel field plate 3084 may be biased so as to further reduce an electric field between the n-type drift lanes 3078 and the p-well 3074. Biasing a p-channel MOS gate (not shown) so as to further deplete a region in the n-type drift lanes 3078 under the p-channel MOS gate advantageously reduces a surface electric field at a junction between the n-type drift lanes 3078 and the p-well 3074, allowing a higher drain potential to be applied. The configurable dual channel 3-D resurf drain extended MOSFET of the instant embodiment may be advantageously operated in the n-channel mode at a higher bias than an n-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

The configurable dual channel 3-D resurf drain extended MOSFET depicted in FIG. 3E may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

Figure 3F:
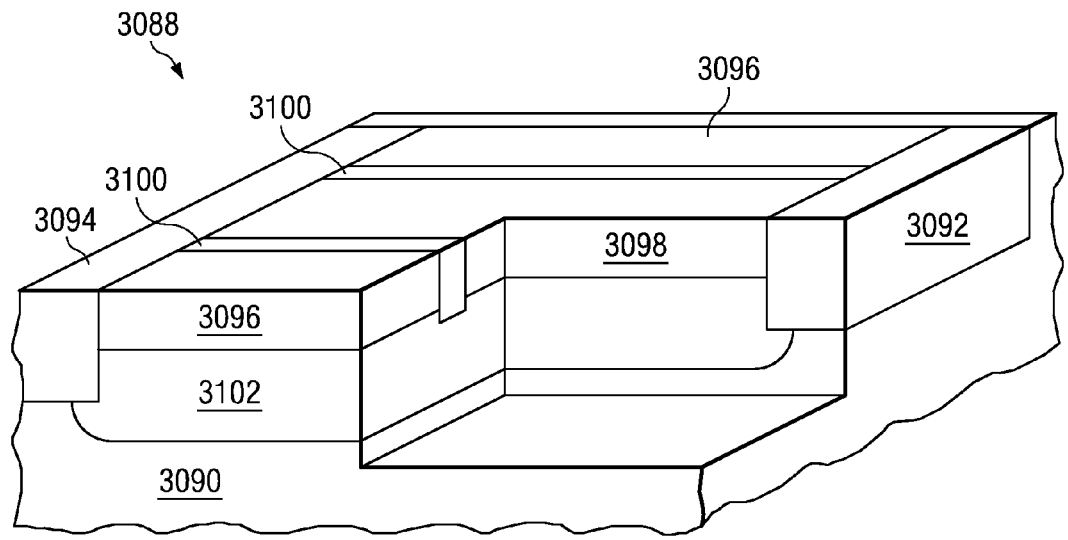

FIG. 3F depicts a sixth embodiment of a lateral drift region in a configurable dual channel 3-D resurf drain extended MOSFET. An integrated circuit 3088 is formed in a substrate 3090 as described in reference to FIG. 1A. An n-well 3092 and a p-well 3094 are formed in the substrate 3090 as described in reference to FIG. 1A. A lateral drift region between the n-well 3092 and the p-well 3094 includes alternating n-type drift lanes 3096 and p-type drift lanes 3098, both of which extend longitudinally from the n-well 3092 to the p-well 3094. Adjacent alternating n-type drift lanes 3096 and p-type drift lanes 3098 are separated by dielectric stripes 3100, such as shallow trench isolation (STI), silicon nitride or other dielectric material or a combination of dielectric materials which induces a strain in the drift lanes 3096 and 3098 to advantageously increase charge carrier mobilities in the drift lanes 3096 and 3098. An electric field at an interface between the dielectric stripes 3100 and the drift lanes 3096, 3098 may be advantageously reduced by selecting a dielectric material with a higher dielectric constant. In one realization of the instant embodiment, the dielectric stripes 3100 extend to a bottom of the drift lanes 3096 and 3098. In another realization, one or more field plates may be formed over the dielectric stripes 3100. In an alternate realization, stress inducing dielectric structures may be formed on top surfaces of the drift lanes 3096, 3098, for example a silicon nitride layer formed over polysilicon field plates formed on the dielectric stripes 3100. A stress induced in each drift lane 3096, 3098 may be compressive or tensile to provide a desired increase in charge carrier mobilities. In one realization of the instant embodiment, a doping density of the n-type drift lanes 3096 and the p-type drift lanes 3098 is between $1 \cdot 10^{14}$ cm$^{-3}$ and $1 \cdot 10^{18}$ cm$^{-3}$. A p-type bottom resurf region 3102 is formed under the n-type drift lanes 3096.

The configurable dual channel 3-D resurf drain extended MOSFET of the instant embodiment may be electrically isolated from other components in the integrated circuit 3088 by field oxide, elements of deep trench isolation, pn junctions or other means.

During operation in a p-channel mode, the p-type drift lanes 3098 are longitudinally depleted so as to reduce a potential difference across the n-well 3092 at the top surface of the substrate 3090. The dielectric stripes 3100 desirably reduce electric fields on lateral surfaces of the p-type drift lanes 3098. Biasing an n-channel MOS gate (not shown) so as to further deplete regions in the p-type drift lanes 3098 under the n-channel MOS gate advantageously reduces surface electric fields at junctions between the p-type drift lanes 3098 and the n-well 3092, allowing a higher drain potential to be applied. The configurable dual channel 3-D resurf drain extended MOSFET of the instant embodiment may be advantageously operated in the p-channel mode at a higher bias than a p-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

During operation in an n-channel mode, the n-type drift lanes 3096 are longitudinally depleted so as to reduce a potential difference across the p-well 3094 at the top surface of the substrate 3090. The p-type bottom resurf regions 3106 cause the n-type drift lanes 3096 to be depleted from below so as to desirably reduce electric fields between the n-type drift lanes 3096 and the p-well 3094, as described in reference to FIG. 3A. The dielectric stripes 3100 desirably reduce electric fields on lateral surfaces of the n-type drift lanes 3096. Biasing a p-channel MOS gate (not shown) so as to further deplete regions in the n-type drift lanes 3096 under the p-channel MOS gate advantageously reduces surface electric fields at junctions between the n-type drift lanes 3096 and the p-well 3094, allowing a higher drain potential to be applied. The configurable dual channel 3-D resurf drain extended MOSFET of the instant embodiment may be advantageously operated in the n-channel mode at a higher bias than an n-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

The configurable dual channel 3-D resurf drain extended MOSFET depicted in FIG. 3F may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

Figure 3G:
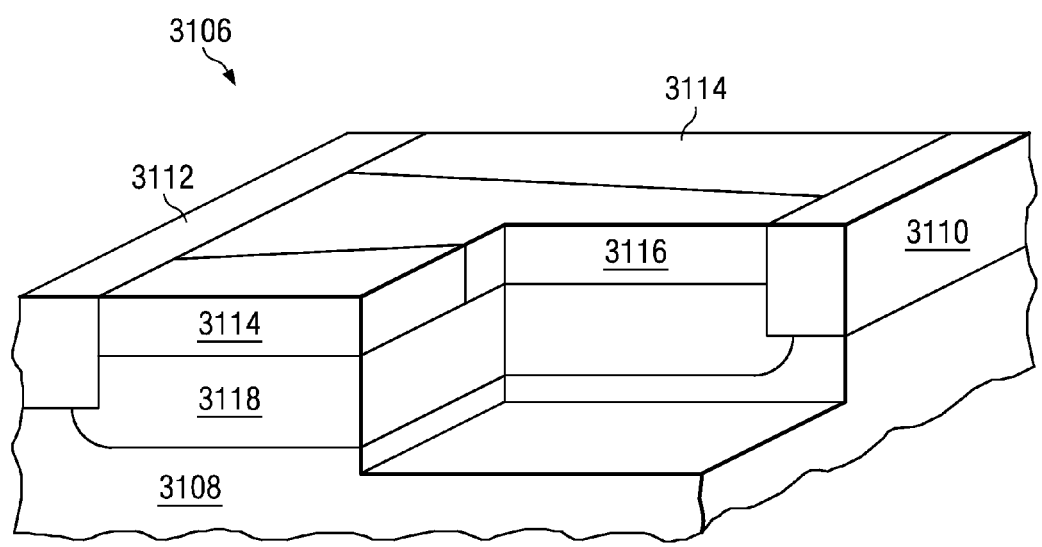

FIG. 3G depicts a seventh embodiment of a lateral drift region in a configurable dual channel 3-D resurf drain extended MOSFET. An integrated circuit 3106 is formed in a substrate 3108 as described in reference to FIG. 1A. An n-well 3110 and a p-well 3112 are formed in the substrate 3108 as described in reference to FIG. 1A. A lateral drift region between the n-well 3110 and the p-well 3112 includes alternating tapered n-type drift lanes 3114 and tapered p-type drift lanes 3116, both of which extend longitudinally from the n-well 3110 to the p-well 3112. The n-type drift lanes 3114 are widest at their drain ends and narrowest at their source ends. Similarly, the p-type drift lanes 3116 are widest at their drain ends and narrowest at their source ends. In one realization of the instant embodiment, a doping density of the n-type drift lanes 3114 and the p-type drift lanes 3116 is between $1 \cdot 10^{14}$ cm$^{-3}$ and $1 \cdot 10^{18}$ cm$^{-3}$. A p-type bottom resurf region 3118 is formed under the n-type drift lanes 3114.

The configurable dual channel 3-D resurf drain extended MOSFET of the instant embodiment may be electrically isolated from other components in the integrated circuit 3106 by field oxide, elements of deep trench isolation, pn junctions or other means.

During operation in a p-channel mode, the p-type drift lanes 3116 are longitudinally depleted so as to reduce a potential difference across the n-well 3110 at the top surface of the substrate 3108. In one embodiment, a doping density of the p-type drift lanes 3116 may be varied along a longitudinal direction to provide a larger voltage drop in depleted regions of the p-type drift lanes 3116. The n-type drift lanes 3114 act as resurf regions on lateral surfaces of the p-type drift lanes 3116. The n-type drift lanes 3114 cause the p-type drift lanes 3116 to be depleted from each side and from below so as to desirably reduce an electric field between the p-type drift lanes 3116 and the n-well 3110, as described in reference to FIG. 3A. Biasing an n-channel MOS gate (not shown) so as to further deplete regions in the p-type drift lanes 3116 under the n-channel MOS gate advantageously reduces surface electric fields at junctions between the p-type drift lanes 3116 and the n-well 3110, allowing a higher drain potential to be applied. The configurable dual channel 3-D resurf drain extended MOSFET of the instant embodiment may be advantageously operated in the p-channel mode at a higher bias than a p-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

During operation in an n-channel mode, the n-type drift lanes 3114 are longitudinally depleted so as to reduce a potential difference across the p-well 3112 at the top surface of the substrate 3108. In one embodiment, a doping density of the n-type drift lanes 3114 may be varied along a longitudinal direction to provide a larger voltage drop in depleted regions of the n-type drift lanes 3114. The p-type drift lanes 3116 provide resurf regions on lateral surfaces of the n-type drift lanes 3114, causing the n-type drift lanes 3114 to be depleted from each side and from below so as to desirably reduce electric fields between the n-type drift lanes 3114 and the p-well 3112. Biasing a p-channel MOS gate (not shown) so as to further deplete regions in the n-type drift lanes 3114 under the p-channel MOS gate advantageously reduces surface electric fields at junctions between the n-type drift lanes 3114 and the p-well 3112, allowing a higher drain potential to be applied. The configurable dual channel 3-D resurf drain extended MOSFET of the instant embodiment may be advantageously operated in the n-channel mode at a higher bias than an n-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

The configurable dual channel 3-D resurf drain extended MOSFET depicted in FIG. 3G may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

Figure 3H:
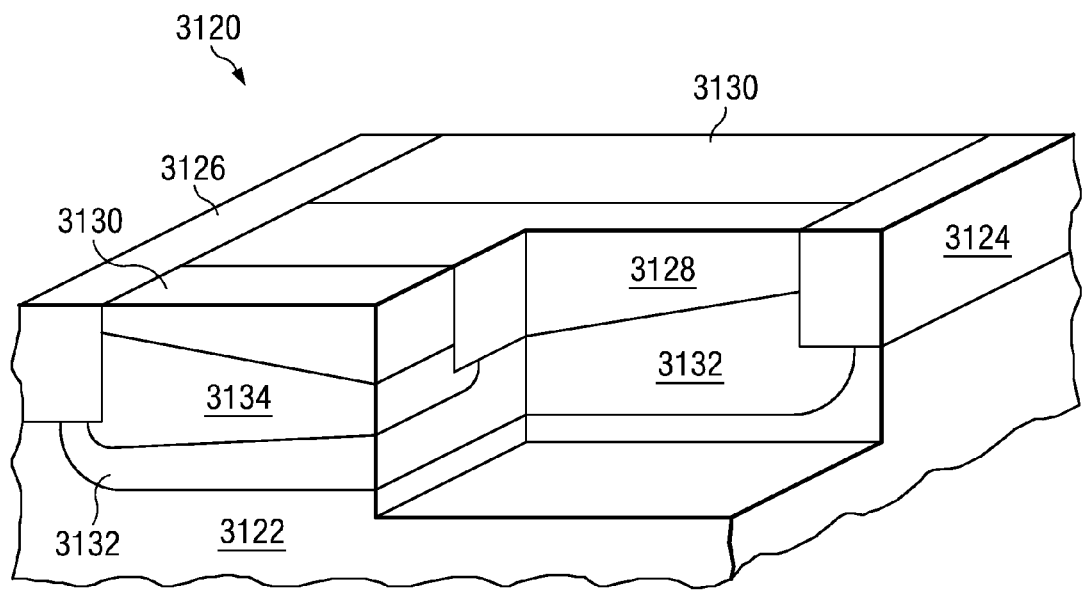

FIG. 3H depicts an eighth embodiment of a lateral drift region in a configurable dual channel 3-D resurf drain extended MOSFET. An integrated circuit 3120 is formed in a substrate 3122 as described in reference to FIG. 1A. An n-well 3124 and a p-well 3126 are formed in the substrate 3122 as described in reference to FIG. 1A. A lateral drift region between the n-well 3124 and the p-well 3126 includes alternating vertically tapered n-type drift lanes 3128 and vertically tapered p-type drift lanes 3130, both of which extend longitudinally from the n-well 3124 to the p-well 3126. The vertically tapered n-type drift lanes 3128 are deepest at their source ends and shallowest at their drain ends. Similarly, the vertically tapered p-type drift lanes 3130 are deepest at their source ends and shallowest at their drain ends. In one realization of the instant embodiment, a doping density of the n-type drift lanes 3128 and the p-type drift lanes 3130 is between $1 \cdot 10^{14}$ cm$^{-3}$ and $1 \cdot 10^{18}$ cm$^{-3}$. A p-type bottom resurf region 3132 is formed under the n-type drift lanes 3128. An n-type bottom resurf region 3134, which may also be vertically tapered, is formed in the p-type bottom resurf region 3132 under the p-type drift lanes 3130.

The configurable dual channel 3-D resurf drain extended MOSFET of the instant embodiment may be electrically isolated from other components in the integrated circuit 3120 by field oxide, elements of deep trench isolation, pn junctions or other means.

During operation in a p-channel mode, the p-type drift lanes 3130 are longitudinally depleted so as to reduce a potential difference across the n-well 3124 at the top surface of the substrate 3122. In one embodiment, a doping density of the p-type drift lanes 3130 may be varied along a longitudinal direction to provide a larger voltage drop in depleted regions of the p-type drift lanes 3130. The n-type drift lanes 3128 and the n-type bottom resurf region 3134 act as resurf regions on lateral and bottom surfaces of the p-type drift lanes 3130, causing the p-type drift lanes 3130 to be depleted from each side and from below so as to desirably reduce an electric field between the p-type drift lanes 3130 and the n-well 3124, as described in reference to FIG. 3A. Biasing an n-channel MOS gate (not shown) so as to further deplete regions in the p-type drift lanes 3130 under the n-channel MOS gate advantageously reduces surface electric fields at junctions between the p-type drift lanes 3130 and the n-well 3124, allowing a higher drain potential to be applied. The configurable dual channel 3-D resurf drain extended MOSFET of the instant embodiment may be advantageously operated in the p-channel mode at a higher bias than a p-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

During operation in an n-channel mode, the n-type drift lanes 3128 are longitudinally depleted so as to reduce a potential difference across the p-well 3126 at the top surface of the substrate 3122. In one embodiment, a doping density of the n-type drift lanes 3128 may be varied along a longitudinal direction to provide a larger voltage drop in depleted regions of the n-type drift lanes 3128. The p-type drift lanes 3130 and the p-type bottom resurf region 3132 provide resurf regions on lateral and bottom surfaces of the n-type drift lanes 3128, causing the n-type drift lanes 3128 to be depleted from each side and from below so as to desirably reduce electric fields between the n-type drift lanes 3128 and the p-well 3126. Biasing a p-channel MOS gate (not shown) so as to further deplete regions in the n-type drift lanes 3128 under the p-channel MOS gate advantageously reduces surface electric fields at junctions between the n-type drift lanes 3128 and the p-well 3126, allowing a higher drain potential to be applied. The configurable dual channel 3-D resurf drain extended MOSFET of the instant embodiment may be advantageously operated in the n-channel mode at a higher bias than an n-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

The configurable dual channel 3-D resurf drain extended MOSFET depicted in FIG. 3H may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

Figure 3I:
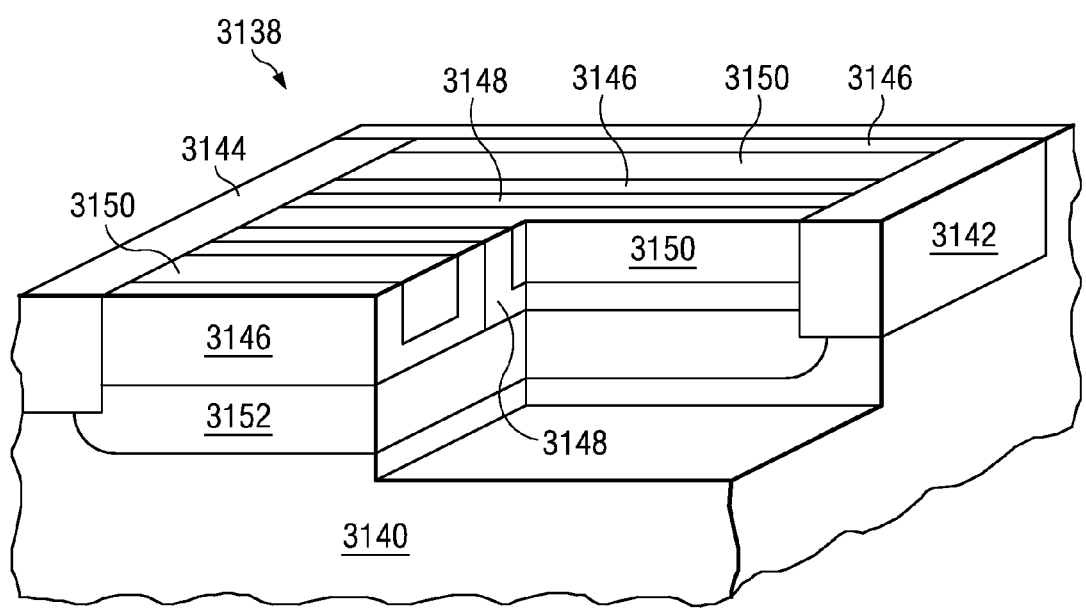

FIG. 3I depicts a ninth embodiment of a lateral drift region in a configurable dual channel 3-D resurf drain extended MOSFET. An integrated circuit 3138 is formed in a substrate 3140 as described in reference to FIG. 1A. An n-well 3142 and a p-well 3144 are formed in the substrate 3140 as described in reference to FIG. 1A. A lateral drift region between the n-well 3142 and the p-well 3144 includes alternating n-type drift lanes 3146 and p-type drift lanes 3148, both of which extend longitudinally from the n-well 3142 to the p-well 3144. Dielectric strips 3150, for example STI elements or deep trench isolation elements, are formed in interior regions of the n-type drift lanes 3146 and/or in the p-type drift lanes 3148, extending to a top surface of the lateral drift region. In one realization of the instant embodiment, one or more field plates may be formed over the dielectric strips 3150. In an alternate realization, stress inducing dielectric structures may be formed over the drift lanes 3146 and 3148, for example a silicon nitride layer formed over polysilicon field plates formed on the dielectric strips 3150. In one realization of the instant embodiment, a doping density of the n-type drift lanes 3146 and the p-type drift lanes 3148 is between $1 \cdot 10^{14}$ cm$^{-3}$ and $1 \cdot 10^{18}$ cm$^{-3}$. In another realization, the drift lanes 3146 and 3148 may be formed by ion implanting dopants into an interface between the p-type drift lanes 3148 and the dielectric strips 3150 in the p-type drift lanes 3148. In yet another realization, the drift lanes 3146 and 3148 may be formed by diffusing dopants using a furnace diffusion process into an interface between the p-type drift lanes 3148 and the dielectric strips 3150 in the p-type drift lanes 3148. In a further realization, the drift lanes 2106, 2108 may be formed by growing epitaxial layers at the interface between the p-type drift lanes 3148 and the dielectric strips 3150 in the p-type drift lanes 3148. P-type bottom resurf regions 3152 are formed under the n-type drift lanes 3146.

The configurable dual channel 3-D resurf drain extended MOSFET of the instant embodiment may be electrically isolated from other components in the integrated circuit 3138 by field oxide, elements of deep trench isolation, pn junctions or other means.

During operation in a p-channel mode, the p-type drift lanes 3148 are longitudinally depleted so as to reduce a potential difference across the n-well 3142 at the top surface of the substrate 3140. The n-type drift lanes 3146 act as resurf regions on lateral surfaces of the p-type drift lanes 3148. The n-type drift lanes 3146 cause the p-type drift lanes 3148 to be depleted from each side and from below so as to desirably reduce an electric field between the p-type drift lanes 3148 and the n-well 3142, as described in reference to FIG. 3A. The dielectric strips 3150 reduce an effective depth of the p-type drift lanes 3148, thus enhancing depletion by the n-type drift lanes 3146 and the n-type bottom resurf regions 3152 which further reduces an electric field between the p-type drift lanes 3148 and the n-well 3142. Biasing an re-channel MOS gate (not shown) so as to further deplete regions in the p-type drift lanes 3148 under the n-channel MOS gate advantageously reduces surface electric fields at junctions between the p-type drift lanes 3148 and the n-well 3142, allowing a higher drain potential to be applied. The configurable dual channel 3-D resurf drain extended MOSFET of the instant embodiment may be advantageously operated in the p-channel mode at a higher bias than a p-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

During operation in an n-channel mode, the n-type drift lanes 3146 are longitudinally depleted so as to reduce a potential difference across the p-well 3144 at the top surface of the substrate 3140. The p-type drift lanes 3148 provide resurf regions on lateral surfaces of the n-type drift lanes 3146, causing the n-type drift lanes 3146 to be depleted from each side and from below so as to desirably reduce electric fields between the n-type drift lanes 3146 and the p-well 3144. The dielectric strips 3150 reduce an effective depth of the n-type drift lanes 3146, thus enhancing depletion by the p-type drift lanes 3148 and the p-type bottom resurf regions 3152, which further reduces an electric field between the n-type drift lanes 3146 and the p-well 3144. Biasing a p-channel MOS gate (not shown) so as to further deplete regions in the n-type drift lanes 3146 under the p-channel MOS gate advantageously reduces surface electric fields at junctions between the n-type drift lanes 3146 and the p-well 3144, allowing a higher drain potential to be applied. The configurable dual channel 3-D resurf drain extended MOSFET of the instant embodiment may be advantageously operated in the n-channel mode at a higher bias than an n-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

The configurable dual channel 3-D resurf drain extended MOSFET depicted in FIG. 3I may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

Figure 3J:
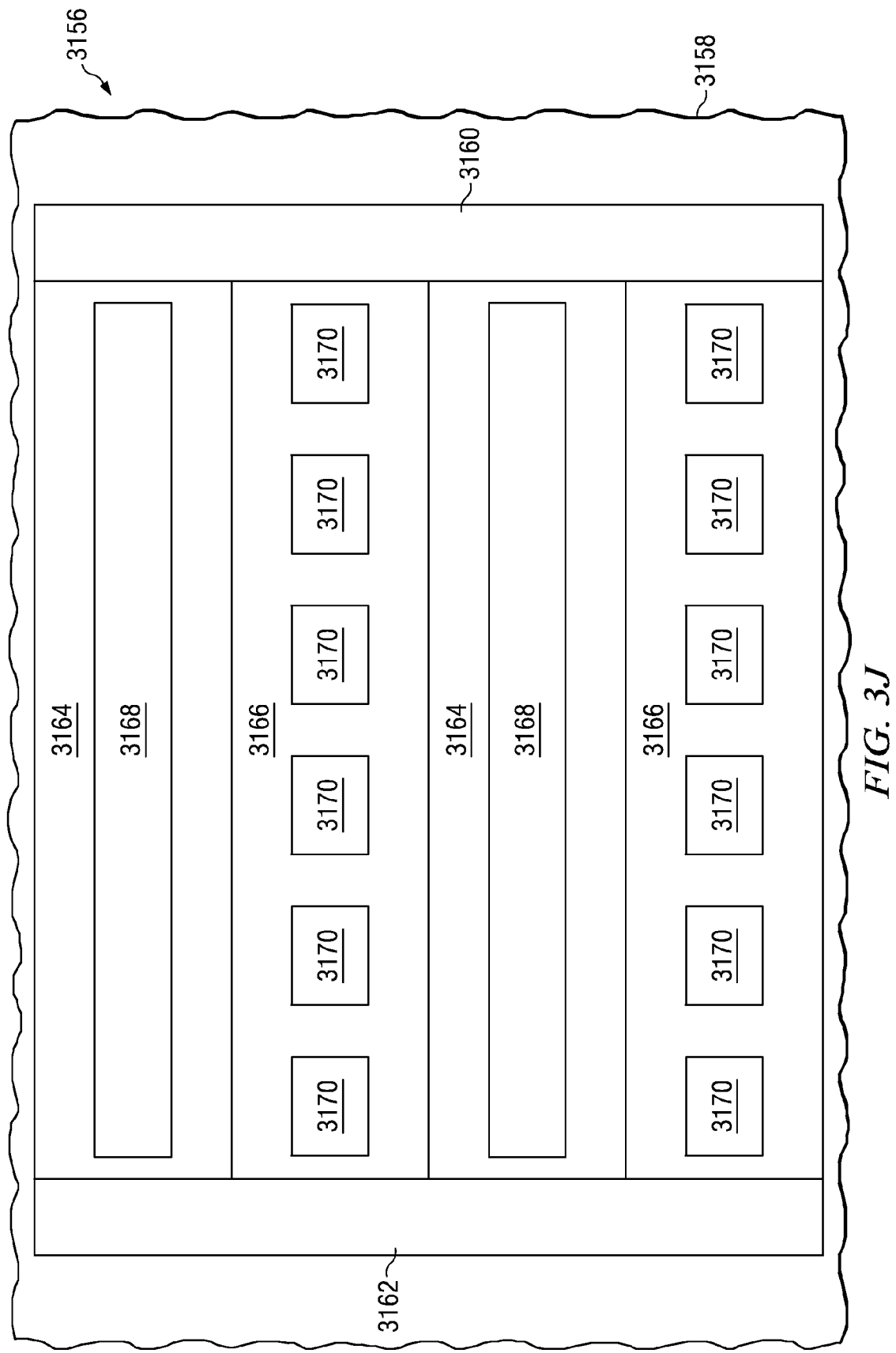

FIG. 3J is a top view of a tenth embodiment of a lateral drift region in a configurable dual channel 3-D resurf drain extended MOSFET. An integrated circuit 3156 is formed in a substrate 3158 as described in reference to FIG. 1A. An n-well 3160 and a p-well 3162 are formed in the substrate 3158 as described in reference to FIG. 1A. A lateral drift region between the n-well 3160 and the p-well 3162 includes alternating n-type drift lanes 3164 and p-type drift lanes 3166, both of which extend longitudinally from the n-well 3160 to the p-well 3162. Extended dielectric strips 3168, for example STI elements, are formed in the n-type drift lanes 3164, extending to within a micron of, and possibly abutting, the n-well 3160 and/or the p-well 3162. A depth of the extended dielectric strips 3168 is at least 200 nanometers less than a depth of the n-type drift lanes 3164. Interrupted dielectric strips 3170, for example STI elements, are formed in the p-type drift lanes 3166, extending to within a micron of, and possibly abutting, the n-well 3160 and/or the p-well 3162. A depth of the interrupted dielectric strips 3170 is at least 200 nanometers less than a depth of the p-type drift lanes 3166. Lengths and separations of the interrupted dielectric strips 3170 may be selected to provide desired levels of stress in the p-type drift lanes 3166 and the n-type drift lanes 3164. In one realization of the instant embodiment, a doping density of the n-type drift lanes 3164 and the p-type drift lanes 3166 is between $1 \cdot 10^{14}$ cm$^{-3}$ and $1 \cdot 10^{18}$ cm$^{-3}$. P-type bottom resurf regions (not shown) are formed under the n-type drift lanes 3164 and n-type bottom resurf regions (not shown) are formed under the p-type drift lanes 3166, as described in reference to FIG. 3I.

The configurable dual channel 3-D resurf drain extended MOSFET of the instant embodiment may be electrically isolated from other components in the integrated circuit 3156 by field oxide, elements of deep trench isolation, pn junctions or other means.

During operation in a p-channel mode, the p-type drift lanes 3166 are longitudinally depleted so as to reduce a potential difference across the n-well 3160 at the top surface of the substrate 3158. The n-type drift lanes 3164 act as resurf regions on lateral surfaces of the p-type drift lanes 3166. The n-type drift lanes 3164 and the n-type bottom resurf regions (not shown) cause the p-type drift lanes 3166 to be depleted from each side and from below so as to desirably reduce an electric field between the p-type drift lanes 3166 and the n-well 3160, as described in reference to FIG. 3A. The interrupted dielectric strips 3170 reduce an effective depth of the p-type drift lanes 3166, thus enhancing depletion by the n-type drift lanes 3164 and the n-type bottom resurf regions (not shown), which further reduces an electric field between the p-type drift lanes 3166 and the n-well 3160. Biasing an n-channel MOS gate (not shown) so as to further deplete regions in the p-type drift lanes 3166 under the n-channel MOS gate advantageously reduces surface electric fields at junctions between the p-type drift lanes 3166 and the n-well 3160, allowing a higher drain potential to be applied. The configurable dual channel 3-D resurf drain extended MOSFET of the instant embodiment may be advantageously operated in the p-channel mode at a higher bias than a p-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions. A spaced configuration of the interrupted dielectric strips 3170 provides a compressive stress to the p-type drift lanes 3166 which desirably increases a hole mobility in the p-type drift lanes 3166, thus advantageously increasing an on-state current density.

During operation in an n-channel mode, the n-type drift lanes 3164 are longitudinally depleted so as to reduce a potential difference across the p-well 3162 at the top surface of the substrate 3158. The p-type drift lanes 3166 provide resurf regions on lateral surfaces of the n-type drift lanes 3164, causing the n-type drift lanes 3164 to be depleted from each side and from below so as to desirably reduce electric fields between the n-type drift lanes 3164 and the p-well 3162. The extended dielectric strips 3168 reduce an effective depth of the n-type drift lanes 3164, thus enhancing depletion by the p-type drift lanes 3166 and the p-type bottom resurf regions (not shown), which further reduces an electric field between the n-type drift lanes 3164 and the p-well 3162. Biasing a p-channel MOS gate (not shown) so as to further deplete regions in the n-type drift lanes 3164 under the p-channel MOS gate advantageously reduces surface electric fields at junctions between the n-type drift lanes 3164 and the p-well 3162, allowing a higher drain potential to be applied. The configurable dual channel 3-D resurf drain extended MOSFET of the instant embodiment may be advantageously operated in the n-channel mode at a higher bias than an n-channel MOS transistor of similar lateral dimensions without resurf regions. In an alternate realization of the instant embodiment, a series resistance of the configurable dual channel 3-D resurf drain extended MOSFET may be reduced compared to a MOSFET of a same size without 3-D resurf depletion regions.

The configurable dual channel 3-D resurf drain extended MOSFET depicted in FIG. 3J may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

FIG. 4A through FIG. 4D are perspective illustrations of integrated circuits formed according to the instant invention containing embodiments of n-channel drain and p-channel source regions, and p-channel drain and n-channel source regions, in configurable dual channel 3-D resurf drain extended MOSFETs. Source and drain contacts, resurf regions, substrates, MOS dielectric layers and MOS gates, as described in reference to FIG. 1A and FIG. 1B, are not depicted in FIG. 4A through FIG. 4D to assist comprehension of the figures. N-channel drain regions and n-channel source regions are n-type regions formed by ion implanting n-type dopants as described in reference to n-channel drain elements depicted in FIG. 1A. Similarly, p-channel drain regions and p-channel source regions are p-type regions formed by ion implanting p-type dopants as described in reference to p-channel source elements depicted in FIG. 1A.

FIG. 4A depicts a first embodiment of an n-channel drain and p-channel source region and a p-channel drain and n-channel source region in a configurable dual channel 3-D resurf drain extended MOSFET. An integrated circuit 4000 contains an n-well 4002 and a p-well 4004, separated by a lateral drift region 4006, as described in reference to FIG. 1A. The n-channel drain and p-channel source region 4008 is formed in the n-well 4002 and includes a p-channel source region 4010 extending across a width of the configurable dual channel 3-D resurf drain extended MOSFET, proximate to, but not contacting, the lateral drift region 4006. The p-channel source region 4010 is separated from the lateral drift region 4006 by a desired p-channel length. The n-channel drain and p-channel source region 4008 further includes an n-channel drain region 4012 formed adjacent to the p-channel source region 4010 opposite from the lateral drift region 4006. In the instant embodiment, the n-channel drain region 4012 extends across the width of the configurable dual channel 3-D resurf drain extended MOSFET.

The p-channel drain and n-channel source region 4014 is formed in the p-well 4004 and includes an n-channel source region 4016 extending across a width of the configurable dual channel 3-D resurf drain extended MOSFET, proximate to, but not contacting, the lateral drift region 4006. The n-channel source region 4016 is separated from the lateral drift region 4006 by a desired n-channel length. The p-channel drain and n-channel source region 4014 further includes a p-channel drain region 4018 formed adjacent to the n-channel source region 4016 opposite from the lateral drift region 4006. In the instant embodiment, the p-channel drain region 4018 extends across the width of the configurable dual channel 3-D resurf drain extended MOSFET.

During operation in a p-channel mode, a p-channel source potential is applied to the p-channel source region 4010 and the n-channel drain region 4012. The p-channel source potential is transferred to the n-well 4002 from the n-channel drain region 4012. A p-channel drain potential is applied to the p-channel drain region 4018 and the n-channel source region 4016. The p-channel drain potential is transferred to the p-well 4004 from the p-channel drain region 4018. A p-channel gate potential is applied to a p-channel MOS gate (not shown) so as to form a p-type inversion layer in the n-well 4002 between the p-channel source region 4010 and the lateral drift region 4006. Drain current flows sequentially through the p-channel drain region 4018, the p-well 4004, p-type drift lanes (not shown) in the lateral drift region 4006, the p-type inversion layer in the n-well 4002 and the p-channel source region 4010. The p-type drift lanes (not shown) in the lateral drift region 4006 are depleted by adjacent resurf regions (not shown), as described in reference to FIG. 3A through FIG. 3J, so as to reduce the p-channel drain potential to a lower value at a junction between the p-type drift lanes and the n-well 4002. Thus, the configurable dual channel 3-D resurf drain extended MOSFET of the instant embodiment may be advantageously operated in the p-channel mode at a higher p-channel drain potential than a p-channel MOS transistor of similar lateral dimensions without resurf regions.

During operation in an n-channel mode, an n-channel source potential is applied to the n-channel source region 4016 and the p-channel drain region 4018. The n-channel source potential is transferred to the p-well 4004 from the p-channel drain region 4018. An n-channel drain potential is applied to the n-channel drain region 4012 and the p-channel source region 4010. The n-channel drain potential is transferred to the n-well 4002 from the n-channel drain region 4012. An n-channel gate potential is applied to an n-channel MOS gate (not shown) so as to form an n-type inversion layer in the p-well 4004 between the n-channel source region 4016 and the lateral drift region 4006. Drain current flows sequentially through the n-channel drain region 4012, the n-well 4002, n-type drift lanes (not shown) in the lateral drift region 4006, the n-type inversion layer in the p-well 4004 and the n-channel source region 4016. The n-type drift lanes (not shown) in the lateral drift region 4006 are depleted by adjacent resurf regions (not shown), as described in reference to FIG. 3A through FIG. 3J, so as to reduce the n-channel drain potential to a lower value at a junction between the n-type drift lanes and the p-well 4004. Thus, the configurable dual channel 3-D resurf drain extended MOSFET of the instant embodiment may be advantageously operated in the n-channel mode at a higher n-channel drain potential than a n-channel MOS transistor of similar lateral dimensions without resurf regions.

The configurable dual channel 3-D resurf drain extended MOSFET depicted in FIG. 4A may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

FIG. 4B depicts a second embodiment of an n-channel drain and p-channel source region and a p-channel drain and n-channel source region in a configurable dual channel 3-D resurf drain extended MOSFET. An integrated circuit 4020 contains an n-well 4022 and a p-well 4024, separated by a lateral drift region 4026, as described in reference to FIG. 1A. The n-channel drain and p-channel source region 4028 is formed in the n-well 4022 and includes a p-channel source region 4030 extending across a width of the configurable dual channel 3-D resurf drain extended MOSFET, proximate to, but not contacting, the lateral drift region 4026. The p-channel source region 4030 is separated from the lateral drift region 4026 by a desired p-channel length. The n-channel drain and p-channel source region 4028 further includes a first strip of field oxide 4032 formed adjacent to the p-channel source region 4030 opposite the lateral drift region 4026. The n-channel drain and p-channel source region 4028 further includes an n-channel drain region 4034 formed adjacent to the first strip of field oxide 4032 opposite the lateral drift region 4026. In the instant embodiment, the n-channel drain region 4034 extends across the width of the configurable dual channel 3-D resurf drain extended MOSFET.

The p-channel drain and n-channel source region 4036 is formed in the p-well 4024 and includes an n-channel source region 4038 extending across a width of the configurable dual channel 3-D resurf drain extended MOSFET, proximate to, but not contacting, the lateral drift region 4026. The n-channel source region 4038 is separated from the lateral drift region 4026 by a desired n-channel length. The p-channel drain and n-channel source region 4036 further includes a second strip of field oxide 4040 formed adjacent to the n-channel source region 4038 opposite the lateral drift region 4026. The p-channel drain and n-channel source region 4036 further includes a p-channel drain region 4042 formed adjacent to the second strip of field oxide 4040 opposite the lateral drift region 4026. In the instant embodiment, the p-channel drain region 4042 extends across the width of the configurable dual channel 3-D resurf drain extended MOSFET.

During operation in a p-channel mode, a p-channel source potential is applied to the p-channel source region 4030 and the n-channel drain region 4034. The p-channel source potential is transferred to the n-well 4022 from the n-channel drain region 4034. A p-channel drain potential is applied to the p-channel drain region 4042 and the n-channel source region 4038. The p-channel drain potential is transferred to the p-well 4024 from the p-channel drain region 4042. A p-channel gate potential is applied to a p-channel MOS gate (not shown) so as to form a p-type inversion layer in the n-well 4022 between the p-channel source region 4030 and the lateral drift region 4026. Drain current flows sequentially through the p-channel drain region 4042, the p-well 4024, p-type drift lanes (not shown) in the lateral drift region 4026, the p-type inversion layer in the n-well 4022 and the p-channel source region 4030. The p-type drift lanes (not shown) in the lateral drift region 4026 are depleted by adjacent resurf regions (not shown), as described in reference to FIG. 3A through FIG. 3J, so as to reduce the p-channel drain potential to a lower value at a junction between the p-type drift lanes and the n-well 4022. Thus, the configurable dual channel 3-D resurf drain extended MOSFET of the instant embodiment may be advantageously operated in the p-channel mode at a higher p-channel drain potential than a p-channel MOS transistor of similar lateral dimensions without resurf regions.

During operation in an n-channel mode, an n-channel source potential is applied to the n-channel source region 4038 and the p-channel drain region 4042. The n-channel source potential is transferred to the p-well 4024 from the p-channel drain region 4042. An n-channel drain potential is applied to the n-channel drain region 4034 and the p-channel source region 4030. The n-channel drain potential is transferred to the n-well 4022 from the n-channel drain region 4034. An n-channel gate potential is applied to an n-channel MOS gate (not shown) so as to form an n-type inversion layer in the p-well 4024 between the n-channel source region 4038 and the lateral drift region 4026. Drain current flows sequentially through the n-channel drain region 4034, the n-well 4022, n-type drift lanes (not shown) in the lateral drift region 4026, the n-type inversion layer in the p-well 4024 and the n-channel source region 4038. The n-type drift lanes (not shown) in the lateral drift region 4026 are depleted by adjacent resurf regions (not shown), as described in reference to FIG. 3A through FIG. 3J, so as to reduce the n-channel drain potential to a lower value at a junction between the n-type drift lanes and the p-well 4024. Thus, the configurable dual channel 3-D resurf drain extended MOSFET of the instant embodiment may be advantageously operated in the n-channel mode at a higher n-channel drain potential than a n-channel MOS transistor of similar lateral dimensions without resurf regions.

The configurable dual channel 3-D resurf drain extended MOSFET depicted in FIG. 4B may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

FIG. 4C depicts a third embodiment of an n-channel drain and p-channel source region and a p-channel drain and n-channel source region in a configurable dual channel 3-D resurf drain extended MOSFET. An integrated circuit 4044 contains an n-well 4046 and a p-well 4048, separated by a lateral drift region 4050, as described in reference to FIG. 1A. The n-channel drain and p-channel source region 4052 is formed in the n-well 4046 and includes p-channel source regions 4054, in p-channel lanes 4056 which extend across a width of the configurable dual channel 3-D resurf drain extended MOSFET, proximate to, but not contacting, the lateral drift region 4050. The p-channel source regions 4054 are separated from the lateral drift region 4050 by a desired p-channel length. The n-channel drain and p-channel source region 4052 further includes n-type well contact regions 4058, in the p-channel lanes 4056, adjacent to the p-channel source regions 4054, opposite the lateral drift region 4050. The n-channel drain and p-channel source region 4052 further includes n-channel drain regions 4060 in n-channel lanes 4062 which extend across a width of the configurable dual channel 3-D resurf drain extended MOSFET, proximate to, but not contacting, the lateral drift region 4050. The n-channel drain regions 4060 are separated from the lateral drift region 4050 by a desired n-channel depletion length.

The p-channel drain and n-channel source region 4064 is formed in the p-well 4048 and includes n-channel source regions 4066, in the n-channel lanes 4062, proximate to, but not contacting, the lateral drift region 4050. The n-channel source regions 4066 are separated from the lateral drift region 4050 by a desired n-channel length. The p-channel drain and n-channel source region 4064 further includes p-type well contact regions 4068, in the n-channel lanes 4062, adjacent to the n-channel source regions 4066, opposite the lateral drift region 4050. The p-channel drain and n-channel source region 4064 further includes p-channel drain regions 4070 in the p-channel lanes 4056, proximate to, but not contacting, the lateral drift region 4050. The p-channel drain regions 4070 are separated from the lateral drift region 4050 by a desired p-channel depletion length.

During operation in a p-channel mode, a p-channel source potential is applied to the p-channel source regions 4054 and the n-type well contact regions 4058. The p-channel source potential is transferred to the n-well 4046 from the n-type well contact regions 4058. A p-channel drain potential is applied to the p-channel drain regions 4070. The p-channel drain potential is transferred to the p-well 4048 from the p-channel drain regions 4070. A p-channel gate potential is applied to a p-channel MOS gate (not shown) so as to form a p-type inversion layer in the n-well 4046 between the p-channel source regions 4054 and the lateral drift region 4050. Drain current flows sequentially through the p-channel drain regions 4070, the p-well 4048, p-type drift lanes (not shown) in the lateral drift region 4050, the p-type inversion layer in the n-well 4046 and the p-channel source regions 4054. The p-type drift lanes (not shown) in the lateral drift region 4050 are depleted by adjacent resurf regions (not shown), as described in reference to FIG. 3A through FIG. 3J, so as to reduce the p-channel drain potential to a lower value at a junction between the p-type drift lanes and the n-well 4046. Thus, the configurable dual channel 3-D resurf drain extended MOSFET of the instant embodiment may be advantageously operated in the p-channel mode at a higher p-channel drain potential than a p-channel MOS transistor of similar lateral dimensions without resurf regions.

During operation in an n-channel mode, an n-channel source potential is applied to the n-channel source regions 4066 and the p-type well contact regions 4068. The n-channel source potential is transferred to the p-well 4048 from the p-type well contact regions 4068. An n-channel drain potential is applied to the n-channel drain regions 4060. The n-channel drain potential is transferred to the n-well 4046 from the n-channel drain regions 4060. An n-channel gate potential is applied to an n-channel MOS gate (not shown) so as to form an n-type inversion layer in the p-well 4048 between the n-channel source regions 4066 and the lateral drift region 4050. Drain current flows sequentially through the n-channel drain regions 4060, the n-well 4046, n-type drift lanes (not shown) in the lateral drift region 4050, the n-type inversion layer in the p-well 4048 and the n-channel source regions 4066. The n-type drift lanes (not shown) in the lateral drift region 4050 are depleted by adjacent resurf regions (not shown), as described in reference to FIG. 3A through FIG. 3J, so as to reduce the n-channel drain potential to a lower value at a junction between the n-type drift lanes and the p-well 4048. Thus, the configurable dual channel 3-D resurf drain extended MOSFET of the instant embodiment may be advantageously operated in the n-channel mode at a higher n-channel drain potential than an n-channel MOS transistor of similar lateral dimensions without resurf regions.

The configurable dual channel 3-D resurf drain extended MOSFET depicted in FIG. 4C may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

FIG. 4D depicts a fourth embodiment of an n-channel drain and p-channel source region and a p-channel drain and n-channel source region in a configurable dual channel 3-D resurf drain extended MOSFET. An integrated circuit 4072 contains an n-well 4074 and a p-well 4076, separated by a lateral drift region 4078, as described in reference to FIG. 1A. The n-channel drain and p-channel source region 4080 is formed in the n-well 4074 and includes a p-channel source region 4082 which extends across a width of the configurable dual channel 3-D resurf drain extended MOSFET, proximate to, but not contacting, the lateral drift region 4078. The p-channel source region 4082 is separated from the lateral drift region 4078 by a desired p-channel length. The n-channel drain and p-channel source region 4080 further includes n-type well contact regions 4084 embedded in the p-channel source region 4082.

The p-channel drain and n-channel source region 4086 is formed in the p-well 4076 and includes an n-channel source region 4088 which extends across a width of the configurable dual channel 3-D resurf drain extended MOSFET, proximate to, but not contacting, the lateral drift region 4078. The n-channel source region 4088 is separated from the lateral drift region 4078 by a desired n-channel length. The p-channel drain and n-channel source region 4086 further includes p-type well contact regions 4090 embedded in the n-channel source region 4088.

During operation in a p-channel mode, a p-channel source potential is applied to the p-channel source region 4082 and the n-type well contact regions 4084. The p-channel source potential is transferred to the n-well 4074 from the n-type well contact regions 4084. A p-channel drain potential is applied to the p-type well contact regions 4090. The p-channel drain potential is transferred to the p-well 4076 from the p-type well contact regions 4090. A p-channel gate potential is applied to a p-channel MOS gate (not shown) so as to form a p-type inversion layer in the n-well 4074 between the p-channel source region 4082 and the lateral drift region 4078. Drain current flows sequentially through the p-type well contact regions 4090, the p-well 4076, p-type drift lanes (not shown) in the lateral drift region 4078, the p-type inversion layer in the n-well 4074 and the p-channel source region 4082. The p-type drift lanes (not shown) in the lateral drift region 4078 are depleted by adjacent resurf regions (not shown), as described in reference to FIG. 3A through FIG. 3J, so as to reduce the p-channel drain potential to a lower value at a junction between the p-type drift lanes and the n-well 4074. Thus, the configurable dual channel 3-D resurf drain extended MOSFET of the instant embodiment may be advantageously operated in the p-channel mode at a higher p-channel drain potential than a p-channel MOS transistor of similar lateral dimensions without resurf regions.

During operation in an n-channel mode, an n-channel source potential is applied to the n-channel source region 4088 and the p-type well contact regions 4090. The n-channel source potential is transferred to the p-well 4076 from the p-type well contact regions 4090. An n-channel drain potential is applied to the n-type well contact regions 4084. The p-channel drain potential is transferred to the n-well 4074 from the n-type well contact regions 4084. An n-channel gate potential is applied to an n-channel MOS gate (not shown) so as to form an n-type inversion layer in the p-well 4076 between the n-channel source region 4088 and the lateral drift region 4078. Drain current flows sequentially through the n-type well contact regions 4084, the n-well 4074, n-type drift lanes (not shown) in the lateral drift region 4078, the n-type inversion layer in the p-well 4076 and the n-channel source region 4088. The n-type drift lanes (not shown) in the lateral drift region 4078 are depleted by adjacent resurf regions (not shown), as described in reference to FIG. 3A through FIG. 3J, so as to reduce the n-channel drain potential to a lower value at a junction between the n-type drift lanes and the p-well 4076. Thus, the configurable dual channel 3-D resurf drain extended MOSFET of the instant embodiment may be advantageously operated in the n-channel mode at a higher n-channel drain potential than a n-channel MOS transistor of similar lateral dimensions without resurf regions.

The configurable dual channel 3-D resurf drain extended MOSFET depicted in FIG. 4D may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

Figure 4E:
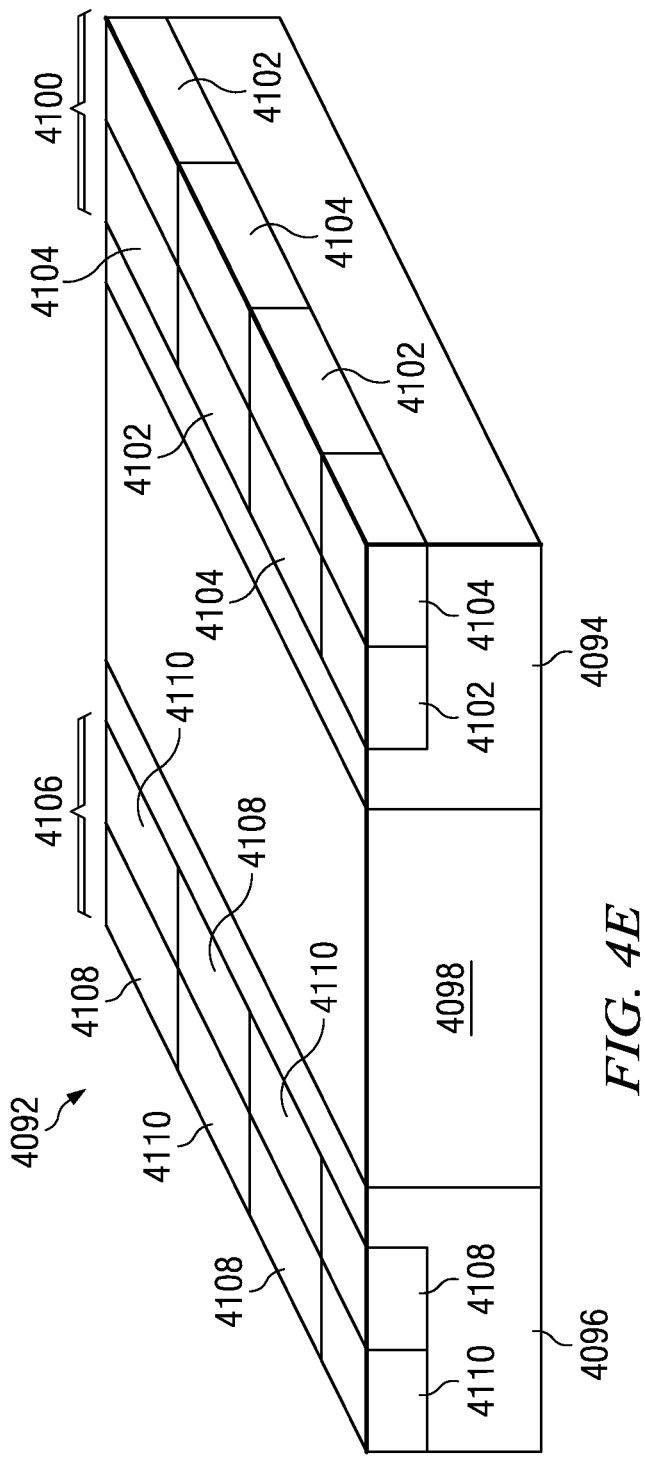

FIG. 4E depicts a fifth embodiment of an n-channel drain and p-channel source region and a p-channel drain and n-channel source region in a configurable dual channel 3-D resurf drain extended MOSFET. An integrated circuit 4092 contains an n-well 4094 and a p-well 4096, separated by a lateral drift region 4098, as described in reference to FIG. 1A. The n-channel drain and p-channel source region 4100 is formed in the n-well 4094 and includes p-channel source regions 4102 and n-channel drain regions 4104 alternating across a width of the configurable dual channel 3-D resurf drain extended MOSFET, proximate to, but not contacting, the lateral drift region 4098. The p-channel source regions 4102 are separated from the lateral drift region 4098 by a desired p-channel length and are aligned with p-type lanes (not shown) in the lateral drift region 4098. The p-channel drain and n-channel source region 4106 is formed in the p-well 4096 and includes n-channel source regions 4108 and p-channel drain regions 4110 alternating across a width of the configurable dual channel 3-D resurf drain extended MOSFET, proximate to, but not contacting, the lateral drift region 4098. The n-channel source regions 4108 are separated from the lateral drift region 4098 by a desired n-channel length and are aligned with n-type lanes (not shown) in the lateral drift region 4098.

During operation in a p-channel mode, a p-channel source potential is applied to the p-channel source regions 4102 and the n-channel drain regions 4104. The p-channel source potential is transferred to the n-well 4094 from the n-channel drain region 4104. A p-channel drain potential is applied to the p-channel drain regions 4110 and the n-channel source regions 4108. The p-channel drain potential is transferred to the p-well 4096 from the p-channel drain region 4110. A p-channel gate potential is applied to a p-channel MOS gate (not shown) so as to form a p-type inversion layer in the n-well 4094 between the p-channel source regions 4102 and the lateral drift region 4098. Drain current flows sequentially through the p-channel drain regions 4110, the p-well 4096, p-type drift lanes (not shown) in the lateral drift region 4098, the p-type inversion layer in the n-well 4094 and the p-channel source regions 4102. The p-type drift lanes (not shown) in the lateral drift region 4098 are depleted by adjacent resurf regions (not shown), as described in reference to FIG. 3A through FIG. 3J, so as to reduce the p-channel drain potential to a lower value at a junction between the p-type drift lanes and the n-well 4094. Thus, the configurable dual channel 3-D resurf drain extended MOSFET of the instant embodiment may be advantageously operated in the p-channel mode at a higher p-channel drain potential than a p-channel MOS transistor of similar lateral dimensions without resurf regions.

During operation in an n-channel mode, an n-channel source potential is applied to the n-channel source regions 4108 and the p-channel drain regions 4110. The n-channel source potential is transferred to the p-well 4096 from the p-channel drain regions 4110. An n-channel drain potential is applied to the n-channel drain regions 4104 and the p-channel source regions 4102. The n-channel drain potential is transferred to the n-well 4094 from the n-channel drain regions 4104. An n-channel gate potential is applied to an n-channel MOS gate (not shown) so as to form an n-type inversion layer in the p-well 4096 between the n-channel source regions 4108 and the lateral drift region 4098. Drain current flows sequentially through the n-channel drain regions 4104, the n-well 4094, n-type drift lanes (not shown) in the lateral drift region 4098, the n-type inversion layer in the p-well 4096 and the n-channel source regions 4108. The n-type drift lanes (not shown) in the lateral drift region 4098 are depleted by adjacent resurf regions (not shown), as described in reference to FIG. 3A through FIG. 3J, so as to reduce the n-channel drain potential to a lower value at a junction between the n-type drift lanes and the p-well 4096. Thus, the configurable dual channel 3-D resurf drain extended MOSFET of the instant embodiment may be advantageously operated in the n-channel mode at a higher n-channel drain potential than a n-channel MOS transistor of similar lateral dimensions without resurf regions.

The configurable dual channel 3-D resurf drain extended MOSFET depicted in FIG. 4E may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

Figure 5A:
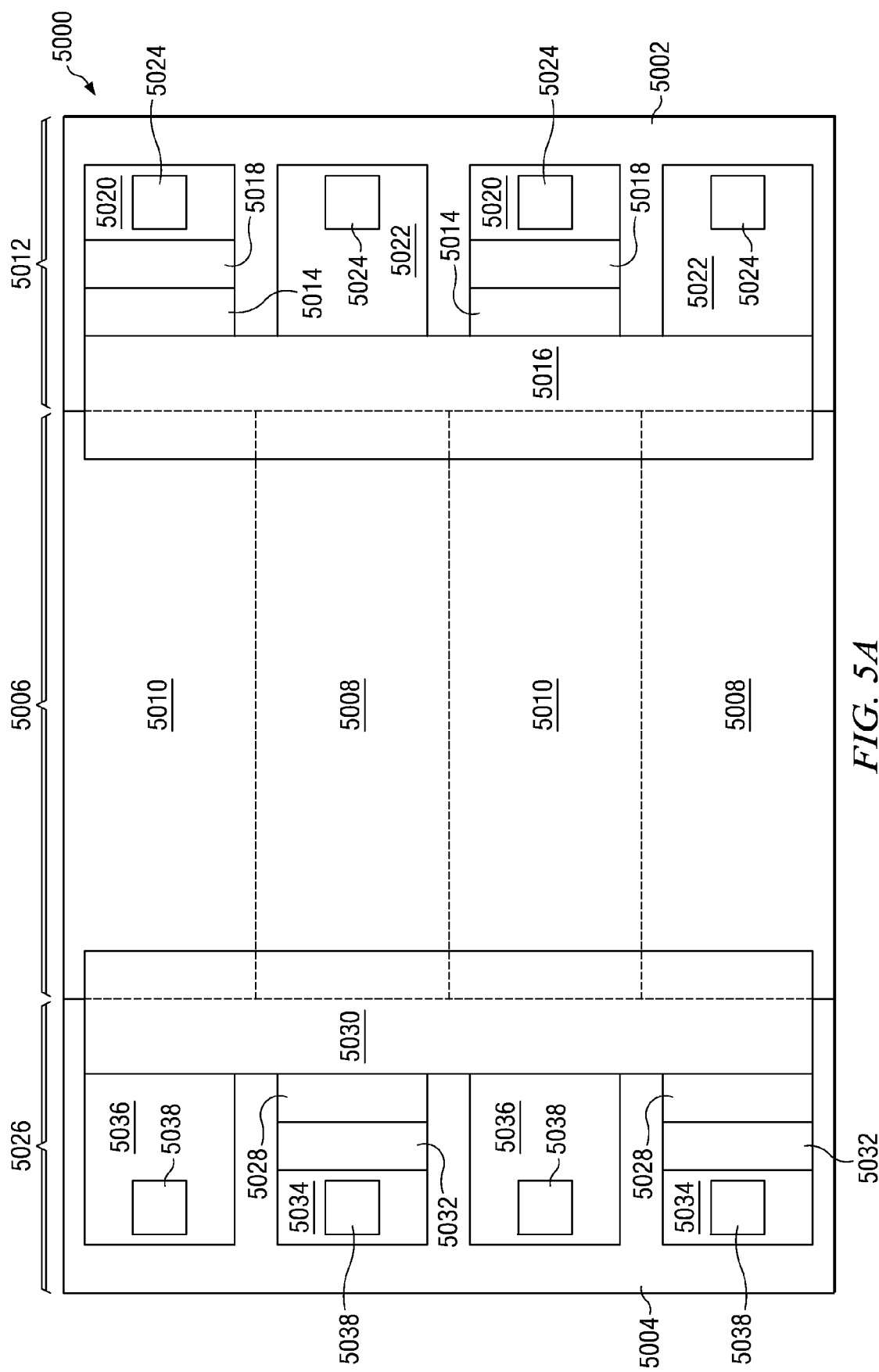
FIGS. 5A and 5B are plan views of integrated circuits including embodiments of n-channel drain and p-channel source regions cascoded with NMOS transistors, and p-channel drain and n-channel source regions cascoded with PMOS transistors, in configurable dual channel 3-D resurf drain extended MOSFETs according to principles of the invention.
Figure 5B:
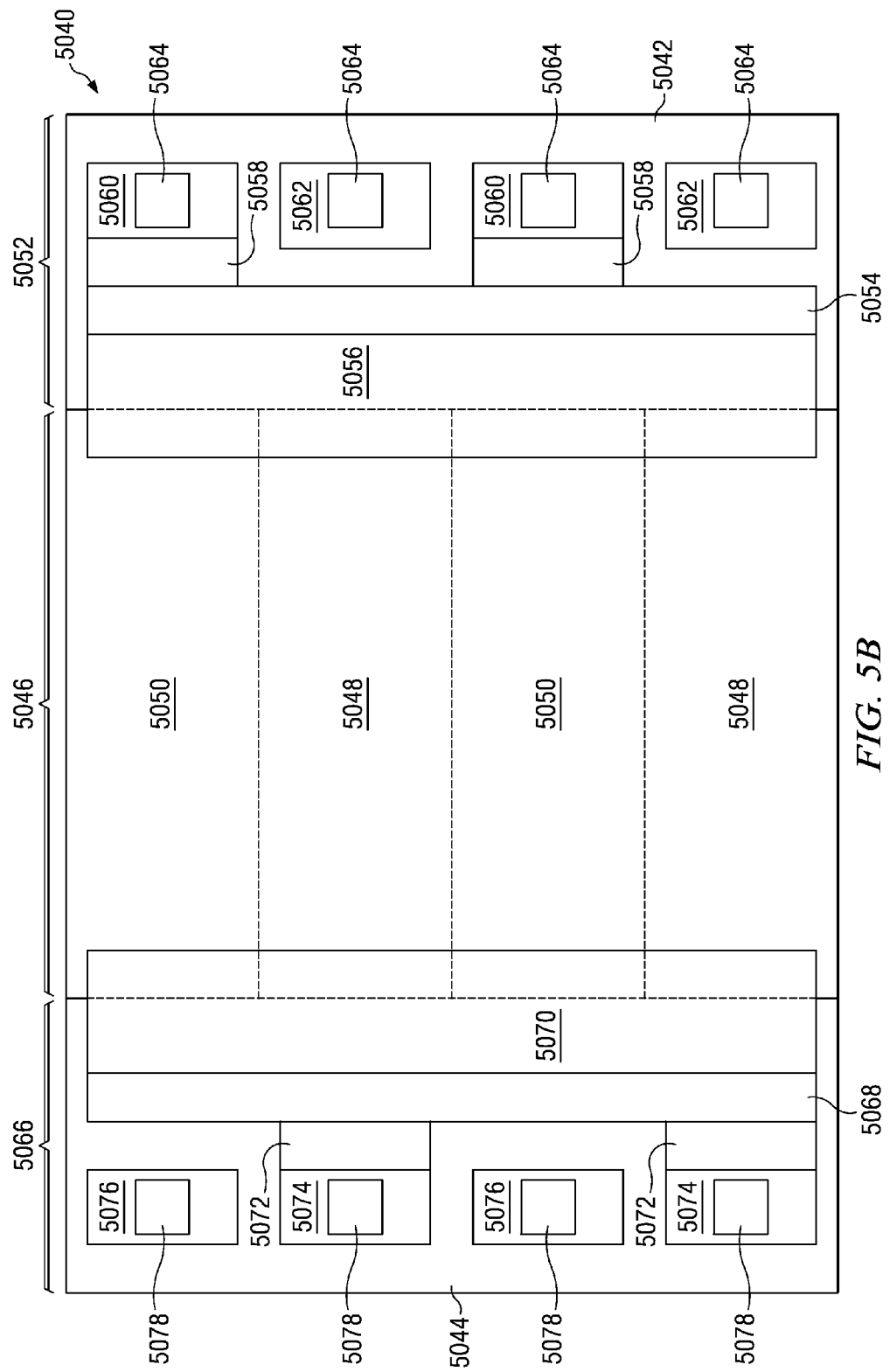

FIG. 5A and FIG. 5B are perspective illustrations of integrated circuits formed according to the instant invention containing embodiments of n-channel drain and p-channel source regions cascoded with NMOS transistors, and p-channel drain and n-channel source regions cascoded with PMOS transistors, in configurable dual channel 3-D resurf drain extended MOSFETs resurf regions, substrates, MOS dielectric layers and MOS gates, as described in reference to FIG. 1A and FIG. 1B, are not depicted in FIG. 5A and FIG. 5B to assist comprehension of the figures. N-channel drain regions, MOS n-channel source regions and cascode n-channel source regions are n-type regions formed by ion implanting n-type dopants as described in reference to n-channel drain elements depicted in FIG. 1A. Similarly, p-channel drain regions, MOS p-channel source regions and cascode p-channel source regions are p-type regions formed by ion implanting p-type dopants as described in reference to p-channel source elements depicted in FIG. 1A.

FIG. 5A is a top view of a first embodiment of an n-channel drain and p-channel source region cascoded with a PMOS transistor and a p-channel drain and n-channel source cascoded with an NMOS transistor in a configurable dual channel 3-D resurf drain extended MOSFET. An integrated circuit 5000 contains an n-well 5002 and a p-well 5004, separated by a lateral drift region 5006, as described in reference to FIG. 1A. The lateral drift region 5006 contains n-type drift regions 5008 and p-type drift regions 5010, depicted schematically in FIG. 5A. The n-channel drain and cascoded p-channel source region 5012 is formed in the n-well 5002 and includes MOS p-channel source regions 5014, proximate to, but not contacting, the lateral drift region 5006. The MOS p-channel source regions 5014 are separated from the lateral drift region 5006 by a desired p-channel MOS channel length. The MOS p-channel source regions 5014 are preferably formed in alignment with the p-type drift regions 5010 in the lateral drift region 5006. A p-channel MOS dielectric layer is formed on a top surface of the n-well 5002 between the MOS p-channel source regions 5014 and the lateral drift region 5006, as described in reference to the p-channel MOS dielectric layer depicted in FIG. 1A. A p-channel MOS gate 5016 is formed on a top surface of the p-channel MOS dielectric layer, as described in reference to the p-channel MOS gate depicted in FIG. 1A.

The MOS p-channel source regions 5014 serve as drain regions for the PMOS cascode transistors. PMOS cascode dielectric layers are formed on a top surface of the n-well 5002 adjacent to the MOS p-channel source regions 5014 by processes similar to those described in reference to the p-channel MOS dielectric layer depicted in FIG. 1A. PMOS cascode gates 5018 are formed on top surfaces of the PMOS cascode dielectric layers, as described in reference to the p-channel MOS gate depicted in FIG. 1A. P-channel cascode source regions 5020 are formed in the n-well 5002 adjacent to the PMOS gate dielectric layers and PMOS cascode gates 5018 opposite the MOS p-channel source regions 5014. N-channel drain regions 5022 are formed in the n-well 5002 adjacent to the lateral drift region 5006, preferably aligned with the n-type drift regions 5008. N-channel drain/p-channel source contacts 5024 are formed on the p-channel cascode source regions 5020 and the n-channel drain regions 5022.

The p-channel drain and cascoded n-channel source region 5026 is formed in the p-well 5004 and includes MOS n-channel source regions 5028, proximate to, but not contacting, the lateral drift region 5006. The MOS n-channel source regions 5028 are separated from the lateral drift region 5006 by a desired n-channel MOS channel length. The MOS n-channel source regions 5028 are preferably formed in alignment with the n-type drift regions 5008 in the lateral drift region 5006. An n-channel MOS dielectric layer is formed on a top surface of the p-well 5004 between the MOS n-channel source regions 5028 and the lateral drift region 5006, as described in reference to the n-channel MOS dielectric layer depicted in FIG. 1A. An n-channel MOS gate 5030 is formed on a top surface of the n-channel MOS dielectric layer, as described in reference to the n-channel MOS gate depicted in FIG. 1A.

The MOS n-channel source regions 5028 serve as drain regions for the NMOS cascode transistors. NMOS cascode dielectric layers are formed on a top surface of the p-well 5004 adjacent to the MOS n-channel source regions 5028 by processes similar to those described in reference to the p-channel MOS dielectric layer depicted in FIG. 1A. NMOS cascode gates 5032 are formed on top surfaces of the NMOS cascode dielectric layers. N-channel cascode source regions 5034 are formed in the p-well 5004 adjacent to the NMOS gate dielectric layers and NMOS cascode gates 5032 opposite the MOS n-channel source regions 5028. P-channel drain regions 5036 are formed in the p-well 5004 adjacent to the lateral drift region 5006, preferably aligned with the p-type drift regions 5010. P-channel drain/n-channel source contacts 5038 are formed on the n-channel cascode source regions 5034 and the p-channel drain regions 5036.

During operation in a p-channel mode, a p-channel source potential is applied to the n-channel drain/p-channel source contacts 5024. The p-channel source potential is transferred to the n-channel drain regions 5022 and the p-channel cascode source regions 5020 from the n-channel drain/p-channel source contacts 5024, and then to the n-well 5002 from the n-channel drain regions 5022. A p-channel drain potential is applied to the p-channel drain/n-channel source contacts 5038. The p-channel drain potential is transferred to the p-channel drain regions 5036 from the p-channel drain/n-channel source contacts 5038, and then to the p-well 5004 from the p-channel drain regions 5036. A p-channel gate potential is applied to the p-channel MOS gate 5030 so as to form a MOS p-type inversion layer in the n-well 5002 between the MOS p-channel source regions 5014 and the lateral drift region 5006. The p-channel gate potential is also applied to the PMOS cascode gates 5018 so as to form a cascode PMOS p-type inversion layer in the n-well 5002 between the MOS p-channel source regions 5014 and the p-channel cascode source regions 5020. Drain current flows sequentially through the p-channel drain/n-channel source contacts 5038, the p-channel drain regions 5036, the p-well 5004, p-type drift lanes 5010 in the lateral drift region 5006, the MOS p-type inversion layer in the n-well 5002 under the p-channel MOS gate 5016, the MOS p-channel source regions 5014, the cascode PMOS p-type inversion layer in the n-well 5002 under the PMOS cascode gates 5018, the p-channel cascode source regions 5020 and the n-channel drain/p-channel source contacts 5024. Drain current through the MOS p-channel source regions 5014, the cascode PMOS p-type inversion layer in the n-well 5002 and the p-channel cascode source regions 5020 generates a potential difference between the MOS p-channel source regions 5014 and the n-well 5002, which advantageously reverse biases a source-body junction of a p-channel MOS transistor, desirably reducing parallel current flow through a parasitic bipolar pnp transistor under the p-channel MOS transistor. The p-type drift lanes 5010 in the lateral drift region 5006 are depleted by adjacent resurf regions (not shown), as described in reference to FIG. 3A through FIG. 3J, so as to reduce the p-channel drain potential to a lower value at a junction between the p-type drift lanes 5010 and the n-well 5002. Thus, the configurable dual channel 3-D resurf drain extended MOSFET of the instant embodiment may be advantageously operated in the p-channel mode at a higher p-channel drain potential than a p-channel MOS transistor of similar lateral dimensions without resurf regions.

During operation in an n-channel mode, an n-channel source potential is applied to the p-channel drain/n-channel source contacts 5038. The n-channel source potential is transferred to the p-channel drain regions 5036 and the n-channel cascode source regions 5034 from the p-channel drain/n-channel source contacts 5038, and then to the p-well 5004 from the p-channel drain regions 5036. An n-channel drain potential is applied to the n-channel drain/p-channel source contacts 5024. The n-channel drain potential is transferred to the n-channel drain regions 5022 from the n-channel drain/p-channel source contacts 5024, and then to the n-well 5002 from the n-channel drain regions 5022. An n-channel gate potential is applied to an n-channel MOS gate (not shown) so as to form a MOS n-type inversion layer in the p-well 5004 between the MOS n-channel source regions 5028 and the lateral drift region 5006. The n-channel gate potential is also applied to the NMOS cascode gates 5032 so as to form a cascode NMOS n-type inversion layer in the p-well 5004 between the MOS n-channel source regions 5028 and the n-channel cascode source regions 5034. Drain current flows sequentially through the n-channel drain/p-channel source contacts 5024, the n-channel drain regions 5034, the n-well 5002, n-type drift lanes 5008 in the lateral drift region 5006, the MOS n-type inversion layer in the p-well 5004 under the n-channel MOS gate 5030, the MOS n-channel source regions 5028, the cascode NMOS n-type inversion layer in the p-well 5004 under the NMOS cascode gates 5032, the n-channel cascode source regions 5034 and the p-channel drain/n-channel source contacts 5038. Drain current through the MOS n-channel source regions 5028, the cascode NMOS n-type inversion layer in the p-well 5004 and the n-channel cascode source regions 5034 generates a potential difference between the MOS n-channel source regions 5028 and the p-well 5004, which advantageously reverse biases a source-body junction of an n-channel MOS transistor, desirably reducing parallel current flow through a parasitic bipolar npn transistor under the n-channel MOS transistor. The n-type drift lanes 5008 in the lateral drift region 5006 are depleted by adjacent resurf regions (not shown), as described in reference to FIG. 3A through FIG. 3J, so as to reduce the n-channel drain potential to a lower value at a junction between the n-type drift lanes 5008 and the p-well 5004. Thus, the configurable dual channel 3-D resurf drain extended MOSFET of the instant embodiment may be advantageously operated in the n-channel mode at a higher n-channel drain potential than a n-channel MOS transistor of similar lateral dimensions without resurf regions.

The configurable dual channel 3-D resurf drain extended MOSFET depicted in FIG. 5A may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

FIG. 5B is a top view of a second embodiment of an n-channel drain and p-channel source region cascoded with a PMOS transistor and a p-channel drain and n-channel source cascoded with an NMOS transistor in a configurable dual channel 3-D resurf drain extended MOSFET. An integrated circuit 5040 contains an n-well 5042 and a p-well 5044, separated by a lateral drift region 5046, as described in reference to FIG. 1A. The lateral drift region 5046 contains n-type drift regions 5048 and p-type drift regions 5050, depicted schematically in FIG. 5A. The n-channel drain and cascoded p-channel source region 5052 is formed in the n-well 5042 and includes a MOS p-channel source region 5054, proximate to, but not contacting, the lateral drift region 5006. In the instant embodiment, the MOS p-channel source region 5054 extends across a width of the configurable dual channel 3-D resurf drain extended MOSFET. The MOS p-channel source region 5054 is separated from the lateral drift region 5046 by a desired p-channel MOS channel length. A p-channel MOS dielectric layer is formed on a top surface of the n-well 5042 between the MOS p-channel source region 5054 and the lateral drift region 5046, as described in reference to the p-channel MOS dielectric layer depicted in FIG. 1A. A p-channel MOS gate 5056 is formed on a top surface of the p-channel MOS dielectric layer, as described in reference to the p-channel MOS gate depicted in FIG. 1A.

The MOS p-channel source region 5054 serves as a drain region for the PMOS cascode transistors. PMOS cascode dielectric layers are formed on a top surface of the n-well 5042 adjacent to the MOS p-channel source region 5054 by processes similar to those described in reference to the p-channel MOS dielectric layer depicted in FIG. 1A. In one embodiment, the PMOS cascode dielectric layers are formed concurrently with the p-channel MOS dielectric layer. PMOS cascode gates 5058 are formed on top surfaces of the PMOS cascode dielectric layers, as described in reference to the p-channel MOS gate depicted in FIG. 1A. P-channel cascode source regions 5060 are formed in the n-well 5042 adjacent to the PMOS gate dielectric layers and PMOS cascode gates 5058 opposite the MOS p-channel source region 5054. N-channel drain regions 5062 are formed in the n-well 5042 adjacent to the lateral drift region 5046, preferably aligned with the n-type drift regions 5048. N-channel drain/p-channel source contacts 5064 are formed on the p-channel cascode source regions 5060 and the n-channel drain regions 5062.

The p-channel drain and cascoded n-channel source region 5066 is formed in the p-well 5044 and includes a MOS n-channel source region 5068, proximate to, but not contacting, the lateral drift region 5046. In the instant embodiment, the MOS n-channel source region 5068 extends across a width of the configurable dual channel 3-D resurf drain extended MOSFET. The MOS n-channel source region 5068 is separated from the lateral drift region 5046 by a desired n-channel MOS channel length. An n-channel MOS dielectric layer is formed on a top surface of the p-well 5044 between the MOS n-channel source region 5068 and the lateral drift region 5046, as described in reference to the n-channel MOS dielectric layer depicted in FIG. 1A. An n-channel MOS gate 5070 is formed on a top surface of the p-channel MOS dielectric layer, as described in reference to the p-channel MOS gate depicted in FIG. 1A.

The MOS n-channel source region 5068 serves as a drain region for the NMOS cascode transistors. NMOS cascode dielectric layers are formed on a top surface of the p-well 5044 adjacent to the MOS n-channel source region 5068 by processes similar to those described in reference to the p-channel MOS dielectric layer depicted in FIG. 1A. In an alternate embodiment, the MOS cascode dielectric layers are formed concurrently with the n-channel MOS dielectric layer. NMOS cascode gates 5072 are formed on top surfaces of the NMOS cascode dielectric layers. N-channel cascode source regions 5074 are formed in the p-well 5044 adjacent to the NMOS gate dielectric layers and NMOS cascode gates 5072 opposite the MOS n-channel source region 5068. P-channel drain regions 5076 are formed in the p-well 5044 adjacent to the lateral drift region 5046, preferably aligned with the p-type drift regions 5050. P-channel drain/n-channel source contacts 5078 are formed on the n-channel cascode source regions 5074 and the p-channel drain regions 5076.

During operation in a p-channel mode, a p-channel source potential is applied to the n-channel drain/p-channel source contacts 5064. The p-channel source potential is transferred to the n-channel drain regions 5062 and the p-channel cascode source regions 5060 from the n-channel drain/p-channel source contacts 5064, and then to the n-well 5042 from the n-channel drain regions 5062. A p-channel drain potential is applied to the p-channel drain/n-channel source contacts 5078. The p-channel drain potential is transferred to the p-channel drain regions 5076 from the p-channel drain/n-channel source contacts 5078, and then to the p-well 5044 from the p-channel drain regions 5076. A p-channel gate potential is applied to the p-channel MOS gate 5056 so as to form a MOS p-type inversion layer in the n-well 5042 between the MOS p-channel source region 5054 and the lateral drift region 5046. The p-channel gate potential is also applied to the PMOS cascode gates 5058 so as to form a cascode PMOS p-type inversion layer in the n-well 5042 between the MOS p-channel source region 5054 and the p-channel cascode source regions 5060. Drain current flows sequentially through the p-channel drain/n-channel source contacts 5078, the p-channel drain regions 5076, the p-well 5044, p-type drift lanes 5050 in the lateral drift region 5046, the MOS p-type inversion layer in the n-well 5042 under the p-channel MOS gate 5056, the MOS p-channel source region 5054, the cascode PMOS p-type inversion layer in the n-well 5042 under the PMOS cascode gates 5058, the p-channel cascode source regions 5060 and the n-channel drain/p-channel source contacts 5064. Drain current through the MOS p-channel source region 5054, the cascode PMOS p-type inversion layer in the n-well 5042 and the p-channel cascode source regions 5060 generates a potential difference between the MOS p-channel source region 5054 and the n-well 5042, which advantageously reverse biases a source-body junction of a p-channel MOS transistor, desirably reducing parallel current flow through a parasitic bipolar pnp transistor under the p-channel MOS transistor. The p-type drift lanes 5050 in the lateral drift region 5046 are depleted by adjacent resurf regions (not shown), as described in reference to FIG. 3A through FIG. 3J, so as to reduce the p-channel drain potential to a lower value at a junction between the p-type drift lanes 5050 and the n-well 5042. Thus, the configurable dual channel 3-D resurf drain extended MOSFET of the instant embodiment may be advantageously operated in the p-channel mode at a higher p-channel drain potential than a p-channel MOS transistor of similar lateral dimensions without resurf regions.

During operation in an n-channel mode, an n-channel source potential is applied to the p-channel drain/n-channel source contacts 5078. The n-channel source potential is transferred to the p-channel drain regions 5076 and the n-channel cascode source regions 5074 from the p-channel drain/n-channel source contacts 5078, and then to the p-well 5044 from the p-channel drain regions 5076. An n-channel drain potential is applied to the n-channel drain/p-channel source contacts 5064. The n-channel drain potential is transferred to the n-channel drain regions 5062 from the n-channel drain/p-channel source contacts 5064, and then to the n-well 5042 from the n-channel drain regions 5062. An n-channel gate potential is applied to the n-channel MOS gate 5070 so as to form a MOS n-type inversion layer in the p-well 5044 between the MOS n-channel source region 5068 and the lateral drift region 5046. The n-channel gate potential is also applied to the NMOS cascode gates 5072 so as to form a cascode NMOS n-type inversion layer in the p-well 5044 between the MOS n-channel source region 5068 and the n-channel cascode source regions 5074. Drain current flows sequentially through the n-channel drain/p-channel source contacts 5064, the n-channel drain regions 5062, the n-well 5042, n-type drift lanes 5048 in the lateral drift region 5046, the MOS n-type inversion layer in the p-well 5044 under the n-channel MOS gate 5070, the MOS n-channel source regions 5068, the cascode NMOS n-type inversion layer in the p-well 5044 under the NMOS cascode gates 5072, the n-channel cascode source regions 5074 and the p-channel drain/n-channel source contacts 5078. Drain current through the MOS n-channel source region 5068, the cascode NMOS n-type inversion layer in the p-well 5044 and the n-channel cascode source regions 5074 generates a potential difference between the MOS n-channel source region 5068 and the p-well 5044, which advantageously reverse biases a source-body junction of an n-channel MOS transistor, desirably reducing parallel current flow through a parasitic bipolar npn transistor under the n-channel MOS transistor. The n-type drift lanes 5048 in the lateral drift region 5046 are depleted by adjacent resurf regions (not shown), as described in reference to FIG. 3A through FIG. 3J, so as to reduce the n-channel drain potential to a lower value at a junction between the n-type drift lanes 5048 and the p-well 5044. Thus, the configurable dual channel 3-D resurf drain extended MOSFET of the instant embodiment may be advantageously operated in the n-channel mode at a higher n-channel drain potential than a n-channel MOS transistor of similar lateral dimensions without resurf regions.

The configurable dual channel 3-D resurf drain extended MOSFET depicted in FIG. 5B may also be operated in a dual MOS mode and a dual MOS bipolar enhanced mode, as described in reference to FIG. 2. The dual MOS bipolar enhanced mode provides a total drain current which is greater than a sum of drain currents in the n-channel mode and p-channel mode separately.

Figure 6A:
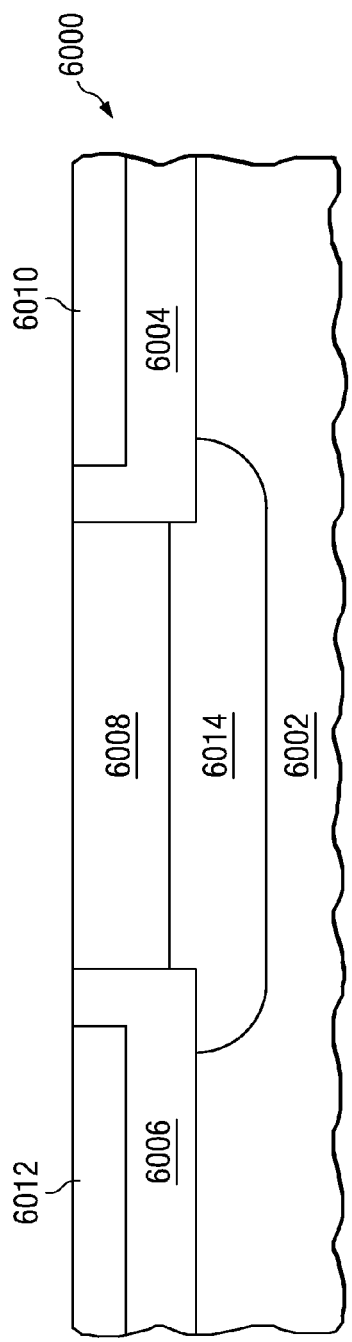
Figure 6B:
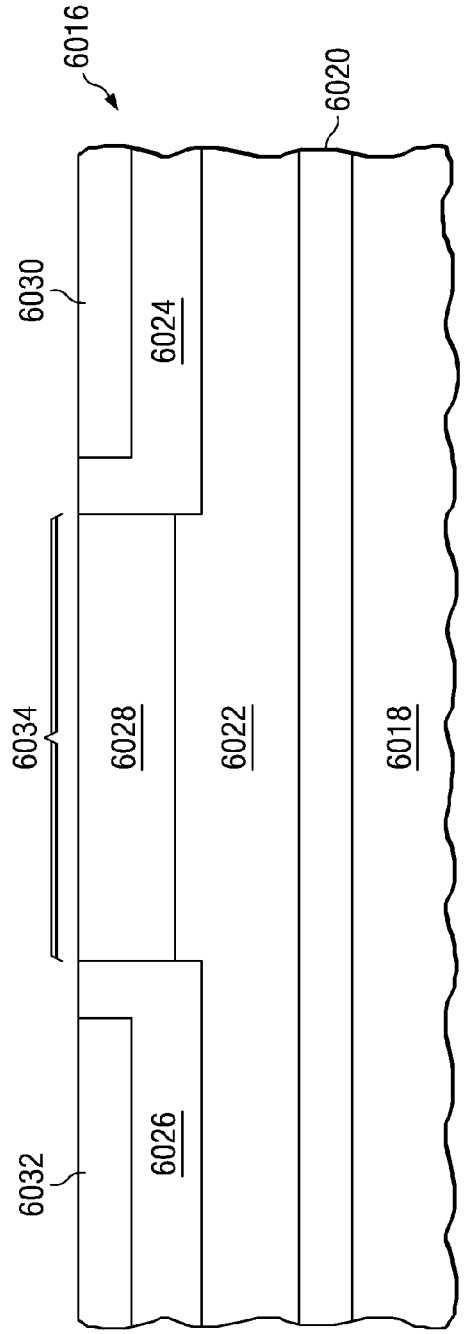

FIG. 6A through FIG. 6C are cross-sections of integrated circuits formed according to the instant invention containing embodiments of bottom resurf regions in configurable dual channel 3-D resurf drain extended MOSFETs. Details of n-channel drain and p-channel source regions, and details of p-channel drain and n-channel source regions, as described in reference to FIG. 4A through FIG. 4D, are not depicted in FIG. 6A through FIG. 6D to assist comprehension of the figures. MOS dielectric layers and MOS gates, as described in reference to FIG. 1A and FIG. 1B, are not depicted in FIG. 6A through FIG. 6D to assist comprehension of the figures.

FIG. 6A is a cross-section of an integrated circuit 6000 is formed in a substrate 6002 as described in reference to FIG. 1A. An n-well 6004 and a p-well 6006 are formed in the substrate 6002 as described in reference to FIG. 1A. A lateral drift region 6008 is formed between the n-well 6004 and the p-well 6006, as described in reference to FIG. 3A through FIG. 3J. An n-channel drain and p-channel source region 6010 is formed in the n-well 6004, as described in reference to FIG. 4A through FIG. 4D. A p-channel drain and n-channel source region 6012 is formed in the p-well 6006, as described in reference to FIG. 4A through FIG. 4D. A bottom resurf region 6014 is formed of a doped region in the substrate 6002. The bottom resurf region 6014 has a conductivity type opposite from a conductivity type of the lateral drift region 6008 immediately above the bottom resurf region 6014. The bottom resurf region 6014 may be formed by ion implanting dopants of an appropriate type into the substrate 6002 at a dose between $1 \cdot 10^{11}$ to $1 \cdot 10^{14}$ atoms/cm2, followed by an anneal operation to activate a portion of the implanted dopants. A bottom resurf photoresist pattern, not shown in FIG. 6A for clarity, may be used to block the dopants from areas outside the bottom resurf region 6014. The bottom resurf region 6014 preferably extends at least 300 nanometers below a bottom surface of the lateral drift region 6008 immediately above the bottom resurf region 6014.

FIG. 6B is a cross-section of an integrated circuit 6016 formed in a semiconductor wafer 6018, possibly an SOI wafer, as described in reference to FIG. 1A. An isolation layer 6020 is formed on a top surface of the wafer 6018. In embodiments using an SOI wafer, the isolation layer 6020 may be a buried oxide layer of silicon dioxide. In other embodiments, the isolation layer 6020 may be a buried doped layer. A device layer film 6022 of single crystal silicon is formed on a top surface of the isolation layer 6020. An n-well 6024 and a p-well 6026 are formed in the device layer film 6022 as described in reference to FIG. 1A. A lateral drift region 6028 is formed between the n-well 6024 and the p-well 6026, as described in reference to FIG. 3A through FIG. 3J. An n-channel drain and p-channel source region 6030 is formed in the n-well 6024, as described in reference to FIG. 4A through FIG. 4D. A p-channel drain and re-channel source region 6032 is formed in the p-well 6026, as described in reference to FIG. 4A through FIG. 4D. A bottom resurf region 6034 is formed in the device layer film 6022 by doping the device layer film 6022 to have a conductivity type opposite from a conductivity type of the lateral drift region 6028 immediately above the bottom resurf region 6034. The bottom resurf region 6034 may be formed by ion implanting dopants of an appropriate type into the device layer film 6022 at a dose between $1 \cdot 10^{11}$ to $1 \cdot 10^{14}$ atoms/cm2, followed by an anneal operation to activate a portion of the implanted dopants.

FIG. 6C is a cross-section of an integrated circuit 6036 formed in an SOI wafer 6038 as described in reference to FIG. 1A. A buried oxide layer 6040 of silicon dioxide is formed on a top surface of the SOI wafer 6038. An SOI film 6042 of single crystal silicon, preferably between 1 and 5 microns thick, is formed on a top surface of the buried oxide layer 6040. Lateral electrical isolation of the configurable dual channel 3-D resurf drain extended MOSFET is provided by isolation elements 6044, which may be silicon dioxide such as deep trench isolation or reverse biased pn junctions. An n-well 6046 and a p-well 6048 are formed in the SOI film 6042 as described in reference to FIG. 1A, so as to extend to the buried oxide layer 6040. A lateral drift region 6050 is formed between the n-well 6046 and the p-well 6048, as described in reference to FIG. 3A through FIG. 3J. An n-channel drain and p-channel source region 6052 is formed in the n-well 6046, as described in reference to FIG. 4A through FIG. 4D. A p-channel drain and n-channel source region 6054 is formed in the p-well 6048, as described in reference to FIG. 4A through FIG. 4D in an alternate realization of the instant embodiment, an upper surface of the buried oxide layer 6040 may be deeper than bottom surfaces of the n-well 6046 and p-well 6048.

FIG. 7A and FIG. 7B depict two embodiments of circuits using configurable dual channel 3-D resurf drain extended MOSFETs in integrated circuits. Referring to FIG. 7A, a first circuit 7000 in an integrated circuit includes a high-side load 7002 with a first node connected to a voltage node 7004 of the integrated circuit. The high side load 7002 may have a constant impedance or a time-varying impedance. The voltage node 7004 may be constant (DC) or may be time-varying. A second node of the high-side load 7002 is connected to an n-channel drain and p-channel source distributed contact of a configurable dual channel 3-D resurf drain extended MOSFET 7006. A p-channel drain and n-channel source distributed contact of the configurable dual channel 3-D resurf drain extended MOSFET 7006 is connected to a ground node 7008 of the integrated circuit. An n-channel MOS gate node of the configurable dual channel 3-D resurf drain extended MOSFET 7006 is coupled to an NMOS gate bias circuit 7010 in the integrated circuit. The NMOS gate bias circuit 7010 provides an appropriate bias potential to an n-channel MOS gate of the configurable dual channel 3-D resurf drain extended MOSFET 7006 so as to enable an n-channel mode in the configurable dual channel 3-D resurf drain extended MOSFET 7006 or to provide field plate functionality in a p-channel mode. A p-channel MOS gate node of the configurable dual channel 3-D resurf drain extended MOSFET 7006 is connected to a PMOS gate bias circuit 7012 in the integrated circuit. The PMOS gate bias circuit 7012 provides an appropriate bias potential to a p-channel MOS gate of the configurable dual channel 3-D resurf drain extended MOSFET 7006 so as to enable a p-channel mode in the configurable dual channel 3-D resurf drain extended MOSFET 7006 or to provide field plate functionality in an n-channel mode. In one realization, the configurable dual channel 3-D resurf drain extended MOSFET 7006 may be operated in a dual p/n channel mode. An optional charge pump circuit 7014 may be coupled to the PMOS gate bias circuit 7012 to provide a gate bias potential to the p-channel MOS gate under some operating conditions. In one realization of the instant embodiment, the configurable dual channel 3-D resurf drain extended MOSFET 7006 may regulate a current through the high-side load 7002. In another realization, the configurable dual channel 3-D resurf drain extended MOSFET 7006 may regulate a voltage drop across the high-side load 7002.

Referring to FIG. 7B, a second circuit 7016 in an integrated circuit includes a low-side load 7018 with a first node connected to a ground node 7020 of the integrated circuit. The low side load 7018 may have a constant impedance or a time-varying impedance. A second node of the low-side load 7018 is connected to a p-channel drain and n-channel source distributed contact of a configurable dual channel 3-D resurf drain extended MOSFET 7022. An n-channel drain and p-channel source distributed contact of the configurable dual channel 3-D resurf drain extended MOSFET 7022 is connected to a voltage node 7024 of the integrated circuit. The voltage node 7024 may be constant (DC) or may be time-varying. A p-channel MOS gate node of the configurable dual channel 3-D resurf drain extended MOSFET 7022 is coupled to a PMOS gate bias circuit 7026 in the integrated circuit. The PMOS gate bias circuit 7026 provides an appropriate bias potential to a p-channel MOS gate of the configurable dual channel 3-D resurf drain extended MOSFET 7022 so as to enable a p-channel mode in the configurable dual channel 3-D resurf drain extended MOSFET 7022 or to provide field plate functionality in an n-channel mode. An n-channel MOS gate node of the configurable dual channel 3-D resurf drain extended MOSFET 7022 is connected to an NMOS gate bias circuit 7028 in the integrated circuit. The NMOS gate bias circuit 7028 provides an appropriate bias potential to an n-channel MOS gate of the configurable dual channel 3-D resurf drain extended MOSFET 7022 so as to enable an n-channel mode in the configurable dual channel 3-D resurf drain extended MOSFET 7022 or to provide field plate functionality in a p-channel mode. In one realization, the configurable dual channel 3-D resurf drain extended MOSFET 7022 may be operated in a dual p/n channel mode. An optional charge pump circuit 7030 may be coupled to the NMOS gate bias circuit 7028 to provide a gate bias potential to the n-channel MOS gate under some operating conditions. In one realization of the instant embodiment, the configurable dual channel 3-D resurf drain extended MOSFET 7022 regulates a current through the low-side load 7018. In another realization, the configurable dual channel 3-D resurf drain extended MOSFET 7022 regulates a voltage drop across the low-side load 7018.

Those skilled in the art to which the invention relates will appreciate that many other embodiments and modifications are possible within the scope of the claimed invention.

What is claimed is:

1. An integrated circuit including a MOS field effect transistor (MOSFET), comprising:
   a lateral drift region, the drift region further including opposite first and second ends; an n-type drift lane extending from the first end to the second end; and a p-type drift lane extending from the first end to the second end;
   a resurf region laterally abutting the lateral drift region;
   an n-well abutting the drift region at the first end;
   a p-well abutting the drift region at the second end;
   an n-type n-channel drain element in the n-well;
   a p-type p-channel source element in the n-well;
   a p-type p-channel drain element in the p-well;
   an n-type n-channel source element in the p-well;
   a p-channel MOS dielectric layer on a top surface of the n-well adjacent to the p-channel source element and overlapping a portion of the drift region;
   an n-channel MOS dielectric layer on a top surface of the p-well adjacent to the re-channel source element and overlapping a portion of the drift region;
   a p-channel MOS gate on a top surface of the p-channel dielectric layer;

an n-channel MOS gate on a top surface of the n-channel dielectric layer;
an n-channel drain and p-channel source distributed contact on a top surface of the re-channel drain element and a top surface of the p-channel source element; and
a p-channel drain and n-channel source distributed contact on a top surface of the p-channel drain element and a top surface of the n-channel source element;
further comprising:
a p-type PMOS cascode drain region in the n-well adjacent to the p-channel MOS gate;
a PMOS cascode dielectric layer on a top surface of the n-well, the PMOS cascode dielectric layer being located between the p-type PMOS cascode drain region and the p-channel source element; and
a PMOS cascode gate on a top surface of the PMOS cascode dielectric layer;
such that the PMOS cascode drain region, the PMOS cascode dielectric layer, the PMOS cascode gate and the p-channel source element form a PMOS transistor in a cascode configuration with the MOSFET.

2. The integrated circuit of claim 1, wherein the n-type drift lane extends to a top surface of the lateral drift region; and the p-type drift lane extends to a top surface of the lateral drift region.

3. The integrated circuit of claim 1, wherein the n-type drift lane extends to a top surface of the lateral drift region; and the p-type drift lane is located under the n-type drift lane.

4. The integrated circuit of claim 1, wherein the lateral drift region further includes epitaxial semiconductor material.

5. The integrated circuit of claim 1, further comprising:
a layer of dielectric material at a top surface of the lateral drift region, such that the layer of dielectric material overlaps the n-type drift lane and the p-type drift lane; and a field plate on a top surface of the layer of dielectric material.

6. The integrated circuit of claim 1, further comprising a set of circuits, the set of circuits being configured to operate the MOSFET in an n-channel mode, in a p-channel mode, and in a dual mode.

7. The integrated circuit of claim 6, further including a charge pump, such that the set of circuits are configured to operate the charge pump so as to provide a gate potential to the n-channel MOS gate.

8. The integrated circuit of claim 1, further comprising:
an n-type NMOS cascode drain region in the p-well adjacent to the n-channel MOS gate;
an NMOS cascode dielectric layer on a top surface of the p-well, the NMOS cascode dielectric layer being located between the n-type NMOS cascode drain region and the n-channel source element; and
an NMOS cascode gate on a top surface of the NMOS cascode dielectric layer;
such that the NMOS cascode drain region, the NMOS cascode dielectric layer, the NMOS cascode gate and the n-channel source element form a NMOS transistor in a cascode configuration with the MOSFET.

9. An integrated circuit including a MOS field effect transistor (MOSFET), comprising:
a lateral drift region, the drift region further including opposite first and second ends; an n-type drift lane extending from the first end to the second end; and a p-type drift lane extending from the first end to the second end;
a resurf region laterally abutting the lateral drift region;
an n-well abutting the drift region at the first end;
a p-well abutting the drift region at the second end;
an n-type n-channel drain element in the n-well;
a p-type p-channel source element in the n-well;
a p-type p-channel drain element in the p-well;
an n-type n-channel source element in the p-well;
a p-channel MOS dielectric layer on a top surface of the n-well adjacent to the p-channel source element and overlapping a portion of the drift region;
an n-channel MOS dielectric layer on a top surface of the p-well adjacent to the re-channel source element and overlapping a portion of the drift region;
a p-channel MOS gate on a top surface of the p-channel dielectric layer;
an n-channel MOS gate on a top surface of the n-channel dielectric layer;
an n-channel drain and p-channel source distributed contact on a top surface of the re-channel drain element and a top surface of the p-channel source element; and
a p-channel drain and n-channel source distributed contact on a top surface of the p-channel drain element and a top surface of the n-channel source element;
further comprising:
an n-type NMOS cascode drain region in the p-well adjacent to the n-channel MOS gate;
an NMOS cascode dielectric layer on a top surface of the p-well, the NMOS cascode dielectric layer being located between the n-type NMOS cascode drain region and the n-channel source element; and
an NMOS cascode gate on a top surface of the NMOS cascode dielectric layer;
such that the NMOS cascode drain region, the NMOS cascode dielectric layer, the NMOS cascode gate and the n-channel source element form a NMOS transistor in a cascode configuration with the MOSFET.

10. The integrated circuit of claim 9, wherein the n-type drift lane extends to a top surface of the lateral drift region; and the p-type drift lane extends to a top surface of the lateral drift region.

11. The integrated circuit of claim 9, wherein the n-type drift lane extends to a top surface of the lateral drift region; and the p-type drift lane is located under the n-type drift lane.

12. The integrated circuit of claim 9, wherein the lateral drift region further includes epitaxial semiconductor material.

13. The integrated circuit of claim 9, further comprising:
a layer of dielectric material at a top surface of the lateral drift region, such that the layer of dielectric material overlaps the n-type drift lane and the p-type drift lane; and a field plate on a top surface of the layer of dielectric material.

14. The integrated circuit of claim 9, further comprising a set of circuits, the set of circuits being configured to operate the MOSFET in an n-channel mode, in a p-channel mode, and in a dual mode.

15. The integrated circuit of claim 14, further including a charge pump, such that the set of circuits are configured to operate the charge pump so as to provide a gate potential to the n-channel MOS gate.

16. A process of forming an integrated circuit, comprising:
providing a substrate;
forming a MOS field effect transistor (MOSFET), by a process further including the steps of:
forming a lateral drift region in the substrate, such that the lateral drift region includes a first end and a second end, the second end being located opposite from the first end;

forming an n-type drift lane in the lateral drift region, such that the n-type drift lane extends from the first end of the drift region to the second end of the drift region;
forming a p-type drift lane in the lateral drift region, such that the p-type drift lane extends from the first end of the drift region to the second end of the drift region;
forming a resurf region, such that the resurf region laterally abuts the lateral drift region;
forming an n-well, such that the n-well abuts the drift region at the first end;
forming a p-well, such that the p-well abuts the drift region at the second end;
forming an n-type n-channel drain element in the n-well;
forming a p-type p-channel source element in the n-well;
forming a p-type p-channel drain element in the p-well;
forming an n-type n-channel source element in the p-well;
forming a p-channel MOS dielectric layer on a top surface of the n-well adjacent to the p-channel source element such that the p-channel MOS dielectric layer overlaps a portion of the drift region;
forming an n-channel MOS dielectric layer on a top surface of the p-well adjacent to the n-channel source element such that the n-channel MOS dielectric layer overlaps a portion of the drift region;
forming a p-channel MOS gate on a top surface of the p-channel dielectric layer;
forming an n-channel MOS gate on a top surface of the n-channel dielectric layer;
forming an n-channel drain and p-channel source distributed contact on a top surface of the n-channel drain element and a top surface of the p-channel source element; and
forming a p-channel drain and n-channel source distributed contact on a top surface of the p-channel drain element and a top surface of the n-channel source element; and
further comprising:
forming a p-type PMOS cascode drain region in the n-well adjacent to the p-channel MOS gate;
forming a PMOS cascode dielectric layer on a top surface of the n-well, such that PMOS cascode dielectric layer is located between the p-type PMOS cascode drain region and the p-channel source element; and
forming a PMOS cascode gate on a top surface of the PMOS cascode dielectric layer;
such that the PMOS cascode drain region, the PMOS cascode dielectric layer, the PMOS cascode gate and the p-channel source element form a PMOS transistor in a cascode configuration with the MOSFET.

17. The process of claim 16, wherein forming the n-type drift lane is performed such that the n-type drift lane extends to a top surface of the lateral drift region; and forming the p-type drift lane is performed such that the p-type drift lane extends to a top surface of the lateral drift region.

18. The process of claim 17, wherein forming the n-type drift lane is performed such that the n-type drift lane extends to a top surface of the lateral drift region; and forming the p-type drift lane is performed such that the p-type drift lane is formed under the n-type drift lane.

19. The process of claim 16, wherein the lateral drift region further comprises etching a trench in the substrate; and growing an epitaxial layer of semiconductor material in the trench.

20. A process of forming an integrated circuit, comprising:
providing a substrate;
forming a MOS field effect transistor (MOSFET), by a process further including the steps of:
forming a lateral drift region in the substrate, such that the lateral drift region includes a first end and a second end, the second end being located opposite from the first end;
forming an n-type drift lane in the lateral drift region, such that the n-type drift lane extends from the first end of the drift region to the second end of the drift region;
forming a p-type drift lane in the lateral drift region, such that the p-type drift lane extends from the first end of the drift region to the second end of the drift region;
forming a resurf region, such that the resurf region laterally abuts the lateral drift region;
forming an n-well, such that the n-well abuts the drift region at the first end;
forming a p-well, such that the p-well abuts the drift region at the second end;
forming an n-type n-channel drain element in the n-well;
forming a p-type p-channel source element in the n-well;
forming a p-type p-channel drain element in the p-well;
forming an n-type n-channel source element in the p-well;
forming a p-channel MOS dielectric layer on a top surface of the n-well adjacent to the p-channel source element such that the p-channel MOS dielectric layer overlaps a portion of the drift region;
forming an n-channel MOS dielectric layer on a top surface of the p-well adjacent to the n-channel source element such that the n-channel MOS dielectric layer overlaps a portion of the drift region;
forming a p-channel MOS gate on a top surface of the p-channel dielectric layer;
forming an n-channel MOS gate on a top surface of the n-channel dielectric layer;
forming an n-channel drain and p-channel source distributed contact on a top surface of the n-channel drain element and a top surface of the p-channel source element; and
forming a p-channel drain and n-channel source distributed contact on a top surface of the p-channel drain element and a top surface of the n-channel source element; and
further comprising:
forming an n-type NMOS cascode drain region in the p-well adjacent to the re-channel MOS gate;
forming an NMOS cascode dielectric layer on a top surface of the p-well, such that NMOS cascode dielectric layer is located between the n-type NMOS cascode drain region and the n-channel source element; and
forming an NMOS cascode gate on a top surface of the NMOS cascode dielectric layer;
wherein the NMOS cascode drain region, the NMOS cascode dielectric layer, the NMOS cascode gate and the n-channel source element form an NMOS transistor in a cascode configuration with the MOSFET.

21. The process of claim 20, wherein forming the n-type drift lane is performed such that the n-type drift lane extends to a top surface of the lateral drift region; and forming the p-type drift lane is performed such that the p-type drift lane extends to a top surface of the lateral drift region.

22. The process of claim 21, wherein forming the n-type drift lane is performed such that the n-type drift lane extends to a top surface of the lateral drift region; and forming the p-type drift lane is performed such that the p-type drift lane is formed under the n-type drift lane.

23. The process of claim 20, wherein the lateral drift region further comprises etching a trench in the substrate; and growing an epitaxial layer of semiconductor material in the trench.

* * * * *